United States Patent [19]
Conboy et al.

[11] Patent Number: 5,455,894
[45] Date of Patent: Oct. 3, 1995

[54] WAFER FABRICATION ROBOTIC INTERFACE UNIT

[75] Inventors: Michael R. Conboy, Buda; Greg A. Smesny, Austin; Kurt W. Nichter, Austin; John G. Zvonar, Austin, all of Tex.

[73] Assignee: Advanced Micro Devices, Sunnyvale, Calif.

[21] Appl. No.: 50,575

[22] Filed: Apr. 19, 1993

[51] Int. Cl.$^6$ .................. G06F 15/00; H05K 3/30; B23P 19/00
[52] U.S. Cl. .................. 395/82; 395/88; 395/93; 395/912; 901/10; 901/16
[58] Field of Search .................. 395/89, 93, 94, 395/912, 82, 88; 29/740; 204/298.25, 298.33; 156/643; 354/317

[56] References Cited

U.S. PATENT DOCUMENTS

| | | | |
|---|---|---|---|
| 4,816,098 | 3/1989 | Davis et al. | 204/298.25 |
| 4,875,989 | 10/1989 | Davis et al. | 204/298.33 |
| 4,906,328 | 3/1990 | Freeman et al. | 156/643 |
| 4,980,971 | 1/1991 | Bartschat et al. | 395/94 |
| 5,084,959 | 2/1992 | Ando et al. | 29/740 |
| 5,105,368 | 4/1992 | Aletandersen et al. | 395/89 |
| 5,216,804 | 1/1993 | Rosier et al. | 29/740 |
| 5,249,356 | 10/1993 | Okuda et al. | 29/740 |
| 5,339,128 | 8/1994 | Tateyama et al. | 354/317 |

*Primary Examiner*—Robert W. Downs
*Assistant Examiner*—Tariq Hafiz
*Attorney, Agent, or Firm*—Kevin L. Daffer

[57] ABSTRACT

An improved wafer transfer and monitoring system is described which utilizes a robotic interface unit. The robotic interface unit includes at least one wafer storage location placed proximate to a wafer stepper unit. A robotic arm attached to the interface unit is moveable in three dimensions to move wafers between the wafer storage location and the wafer stepper unit. The robotic interface unit can be placed between a wafer stepper unit and a coater/developer unit to transfer wafers between each unit and to store and monitor wafers placed upon the units and/or upon the wafer storage location. Accordingly, the robotic interface unit can operate in a stand-alone configuration with the wafer stepper or can be integrated between a wafer stepper and a wafer coater/developer. By using a robotic arm, less contaminates are associated with the exposed and readily cleaned arm. As such, the robotic interface unit and integrated system can be used in class I wafer fabrication areas where cleanliness is important, and the ability to track and monitor wafers is also important.

15 Claims, 19 Drawing Sheets

WAFER FABRICATION ROBOTIC INTERFACE UNIT

BACKGROUND OF THE INVENTION

Incorporated is a computer program listing microfiche appendix of source code used by the robotic interface unit of the present invention to move and monitor semiconductor wafers according to the present invention. Copyright, 1992, Advanced Micro Devices, Inc. A portion of the disclosure of this patent document contains material which is subject to copyright protection. The copyright owner has no objection to the reproduction by anyone of the "Microfiche Appendix," as it appears in the Patent and Trademark Office, but otherwise reserves all copyright rights whatsoever.

1. Field of the Invention

This invention relates to the manufacture of an integrated circuit and more particularly to a robotic interface unit for moving and monitoring semiconductor wafers placed into and out of a wafer fabrication device.

2. Background of the Relevant Art

The fabrication of a semiconductor wafer is well known. Fabrication often begins by the patterning of a particular sequence of successive layers upon the wafer. Patterning of layers, often called photolithography, involves many steps. The first step might be to create silicon dioxide insulating layer on the surface of the silicon wafer. Thereafter, removal of selective portions or sections of the insulting layer may be achieved to expose underlying silicon. Selective removal of silicon dioxide is achieved by spinning a photoresist material across the silicon dioxide surface. A mask is used to allow a source of ionizing radiation to impinge at selective locations across the wafer. Depending upon whether the photoresist is positive-type or negative-type photoresist, certain areas of photoresist may dissolve when exposed to solvents thereby exposing selective areas of silicon dioxide. Thereafter, the exposed portions of silicon dioxide can be removed by etching techniques commonly known in the art.

Placing or coating photoresist across a wafer surface comprising silicon dioxide is achieved by a wafer fabrication device often called a "wafer coater unit." Illustrated in FIG. 1 is a partial view of an exemplary wafer coater 10 according to conventional art. Coater 10 may include several moveable arms 12. Each arm 12 includes an upper surface for receiving a wafer 14. There may be several moveable arms 12 placed along a track (not shown) or path upon which wafers 14 are moved through the coating process. For example, coater 10 may utilized two tracks, one track may be configured to receive a bare silicon wafer upon which silicon dioxide is grown. The other track may be used to receive an exposed, photoresist-coated wafer. Accordingly, coater 10 may incorporate both a photoresist-coater and a developer. The developer portion being the second track which develops exposed photoresist (i.e., removes via a solvent the exposed or radiated portions of photoresist).

An exemplary two-track wafer coater 10, or wafer coater/developer 10, is shown in FIG. 1 illustrating a mechanism for receiving first and second wafer cassettes 16 and 18, respectively, placed at a termination end of each track. First wafer cassette 16 may be utilized to receive and store a plurality of wafers 14 having photoresist coated thereon. Second wafer cassette 18 may be used to receive and store wafers which have been coated with photoresist having select areas exposed to radiation. A control panel 20 placed upon coater/developer 10 allows the operator to visually receive information about wafers processed through each track of coater/developer 10 as well as allowing the operator to monitor and alter the coat and develop process.

Also shown in FIG. 1 is a partial view of a wafer stepper unit 22. Stepper unit 22 is configured to receive coated wafers, and to expose the coated wafers to radiation. Radiation can be either ultraviolet radiation or x-rays, commonly known in the photolithography art. For example, first wafer cassette 16 of coater/developer 10 can be physically carried and placed upon stepper unit 22. Subsequently, exposed wafers can be removed from stepper unit 22 and placed upon coater/developer unit 10 as the second wafer cassette 18. Coater/developer 10 thereafter processes or develops the exposed wafers within cassette 18. As such, stepper unit 22 includes a stepper base 24 having two wafer feed cassettes and two wafer discharge cassettes. The two wafer feed cassettes are denoted as front feed cassette 26 and back feed cassette 28. Likewise, the two discharge cassettes include a front discharge cassette 30 and a back discharge cassette 32. Either the front or back feed cassettes 26 and 28 can receive coated wafers within cassette 16. Further, either the front or back discharge cassettes 30 or 32 can be removed and placed as wafer cassette 18 upon coater/developer 10. Accordingly, stepper unit 22 can be located remote from wafer coater/developer 10.

Associated with the movement of wafers within conventional stepper units 24 are conveyor belts 34. Conveyor belts 34 move the lowest configured wafer from the front feed or discharge cassettes 26 or 30 respectively into and out of the stepper unit, respectively. Belts 34 laterally move wafers to a wafer positional chuck 36 (or p-chuck 36) having air holes placed therein. P-chuck 36 operates to secure the wafer in position, and correct position or alignment of the wafer upon chuck 36 is verified using an optical aligner 38. After alignment, the wafer is transferred to an exposure chuck 41 (or e-chuck 41) via dipod 40. Once the wafer is exposed, it is removed via dipod 40 from e-chuck 41 and placed upon a discharge conveyor belt 34. Dipod 40 has a limited axis of rotation and two upper surfaces for moving the wafers between chucks and onto belt 34. The feed and/or discharge conveyor belts 34 are actuated by a motor 42 and drive means 44 attached thereto. As is appreciated from the drawing of FIG. 1, the photolithography process of coating a wafer, exposing select coated surfaces, and then developing the wafer is achieved by moving wafers to and from coater/developer 10 and stepper 22. As is often the case, movement of wafers is performed by the operator physically handling wafer cassettes and transporting the cassettes between coater/developer 10 and stepper 22.

Referring to FIG. 2, stepper 22 and coater/developer 10 can be connected together as an integrated system. The operator need not physically remove cassettes from one unit and carry that cassette to the other unit. Instead, wafers can be moved between units placed in close proximity to each other via a series of conveyor belts 34. Thus, not only are conveyor belts 34 used for moving wafers within stepper 22 as shown in FIG. 1, but belts of similar configuration can also be used to move wafers between stepper 22 and coater/developer 10 as shown in FIG. 2. An elevator 46, having a conveyor belt 34 placed at its upper surface, can move up and down along the plurality of wafers stored within cassettes 16 and 18. A selected wafer can be removed (generally the lowest wafer from the cassette) by belt 34 to various storage locations at the front and back feed locations within lateral feeder 48. Thereafter, exposed wafers can be removed from stepper 22 via belt 34 and onto feeder 48. Feeder 48 then moves the wafers from the front location or back location onto elevator 46 of coater/developer 10. Accordingly, the integrated system shown in FIG. 2 can be used to complete the coat, expose, and develop process steps with minimum operator input. The entire unit is thereby automated using lateral movers or conveyor belts.

FIG. 3 illustrates a top view of stepper 22 and lateral feeder 48. Lateral feeder may contain several wafer storage locations including one or more wafer cassettes. Front feed cassette 26 and a back feed cassette 28 are shown placed in lateral alignment with conveyor belt 34. Similarly, front and back discharge cassettes 30 and 32, respectively, are aligned with a discharge conveyor belt 34. P-chuck 36 receives the photoresist-coated wafers from selective regions within each cassette 26 and 28. Thereafter dipod 40 moves the coated wafers from p-chuck 36 and places those wafers upon e-chuck 41.

It is appreciated from FIGS. 1, 2 and 3 that laterally moving conveyor belts are used extensively for the movement of wafers within stepper 22 and between stepper 22 and coater/developer 10. Conveyor belts, however, often contain particulate matter on their surfaces which is unsuitable for many Class I fabrication areas. The particulate matter cannot be easily removed without disassembling stepper 22 and/or feeder 48. Consequently, build up of particulate matter upon belts 34 may be transferred to the backside of wafers 14. Dirt or dust particles placed upon wafer 14 may interfere with the electrical characteristics or operation of integrated circuits obtained therefrom. Furthermore, an inherent disadvantage with conveyor belts is their reduced versatility. Wafers can only be moved along a belt path between termination points of each belt. Unless the belt is moved, change in wafer placement cannot be obtained. Moreover, due to the thickness of the belt drive mechanism, only the bottom wafers within associated cassettes can be moved. As such, if upper wafers within a cassette are to be selected, then the lower wafers must first be removed. Still further, wafers from front feed cassette 28 must often be emptied before wafers from back feed cassette 26 can be accessed. Likewise, wafers upon back discharge cassette 32 often must be filled first before wafers upon front discharge cassette 30 is filled. As such, conventional belt design lacks flexibility in the removal and selection of specific wafers within specific feed or discharge cassettes. It is important that specific wafers can be selected and placed within stepper 22 regardless of where those wafers are located in either the front or back feed cassettes. Likewise, it would be advantageous to place wafers in either of the discharge cassettes and at any location within those cassettes for storage and tracking. Not only is it important to quickly access select wafers, but it is also important to monitor and track select wafers in any location within any cassette of the stand-alone stepper units 22 or the integrated stepper and coater/developer unit.

SUMMARY OF THE INVENTION

The problems outlined above are in large part solved by the robotic interface unit of the present invention. That is, the robotic interface unit hereof utilizes a three dimensional robotic arm which selectively picks and places wafers stored in any location within the front and/or back feed cassettes. Likewise, the robotic arm can remove wafers from stepper 22 and place those wafers at any location within front and/or back discharge cassettes. Moreover, the robotic interface unit can be coupled to a coater/developer unit to make an integrated system. The robotic arm can move wafers directly between coater/developer 10 and stepper 22 without the need for placing those wafers at intermediate points. Thus, the present invention utilizes a pick and place robotic system which can directly pick and place a select wafer at programmed locations within the interface unit, stepper unit, and/or coater/developer unit. The need for conveyor belts and the contamination they contain, is eliminated by a single, readily accessible, easily cleaned robotic arm placed upon the robotic interface unit. The robotic arm can be programmed for select movement, and wafers receivable upon the arm can be monitored and tracked throughout the system by a tracking methodology of the present invention.

Broadly speaking, the present invention contemplates a robotic interface unit. The unit comprises at least one wafer storage location configured proximate to a wafer stepper unit. The robotic interface unit further comprises a robotic arm moveable in three dimensions and having an upper extendable surface adapted for moving a wafer between the wafer storage location and the wafer stepper unit. The robotic interface unit and associated stepper unit can be placed remote from a wafer coater/developer unit. Alternatively, the interface unit and stepper unit can be placed adjacent to a wafer coater/developer unit. If placed adjacent to the coater/developer unit, the robotic arm can be adapted for moving a wafer between the wafer coater/developer unit and the wafer stepper unit. Accordingly, the stepper and coater/developer units can be placed remote from each other or connected as an integrated system.

As defined herein, the wafer storage location includes at least one wafer feed location and at least one wafer discharge location. The wafer feed and wafer discharge locations are spaced from each other upon the robotic interface unit. The robotic arm includes a plurality of optical sensors spaced in close proximity to the wafer storage location. An interface network is coupled to the wafer stepper unit, the coater/developer unit and the optical sensors. A computer is then coupled to the interface unit for controlling the movement of the robotic arm in response to a program input stored within the computer. The computer further comprises a memory medium and a keyboard. The keyboard is adapted for allowing access of the program input upon the interface network. A memory medium located within the computer is capable of storing the status of the sensors. The computer also includes a display adapted for visually displaying status of each sensor.

The interface network includes a digital logic controller coupled between the wafer stepper unit and the computer. A programmable logic controller is coupled to the sensors, and an opto-coupled logic controller is coupled between the digital logic controller and the programmable logic controller. The opto-coupled logic controller is further coupled between the wafer stepper unit and the coater/developer unit.

The present invention further contemplates a robotic interface system for transferring wafers between wafer coater/developer unit and a wafer stepper unit. The interface system comprises a wafer coater/developer unit capable of coating a wafer with photoresist and presenting the coated wafer at a pickup location within the coater/developer unit. A wafer stepper unit is capable of selectively exposing the coated wafers and presenting the exposed wafers at a dipod location within the stepper unit. A robotic interface unit can be placed adjacent the wafer stepper unit. The robotic interface unit includes a platform upon which at least one discharge cassette and at least one feed cassette are located. The interface unit further comprises first means for moving the coated wafer from the pickup location to the feed cassette. A robotic arm is coupled to the interface unit and is moveable in three dimensions. The arm includes an upper extendable surface adapted for moving the coated wafer from the feed cassettes to the wafer stepper unit and for moving the exposed wafer from the dipod location to the discharge cassettes.

The present invention further contemplates a method for moving wafers into a wafer stepper unit. The method comprises the steps of providing a wafer stepper unit and placing a robotic interface unit having an arm capable of three dimensional movement adjacent the wafer stepper unit. Next, a computer can be activated having a stored program movement of the arm. The computer informs the arm to move in response to the program movement stored within the computer. The arm moves between the wafer stepper unit and a wafer storage location configured upon the robotic interface unit. Accordingly, the method hereof includes a method for moving wafers into a stepper unit from a wafer storage location configured upon the robotic interface unit. Alternatively, or in addition to the movement from the interface unit to the stepper unit, wafers can be moved directly from a coater/developer unit to the interface unit or from the coater/developer unit to the stepper unit.

BRIEF DESCRIPTION OF THE DRAWINGS

Other objects and advantages of the invention will become apparent upon reading the following detailed description and upon reference to accompanying drawings in which.

Figure 1:
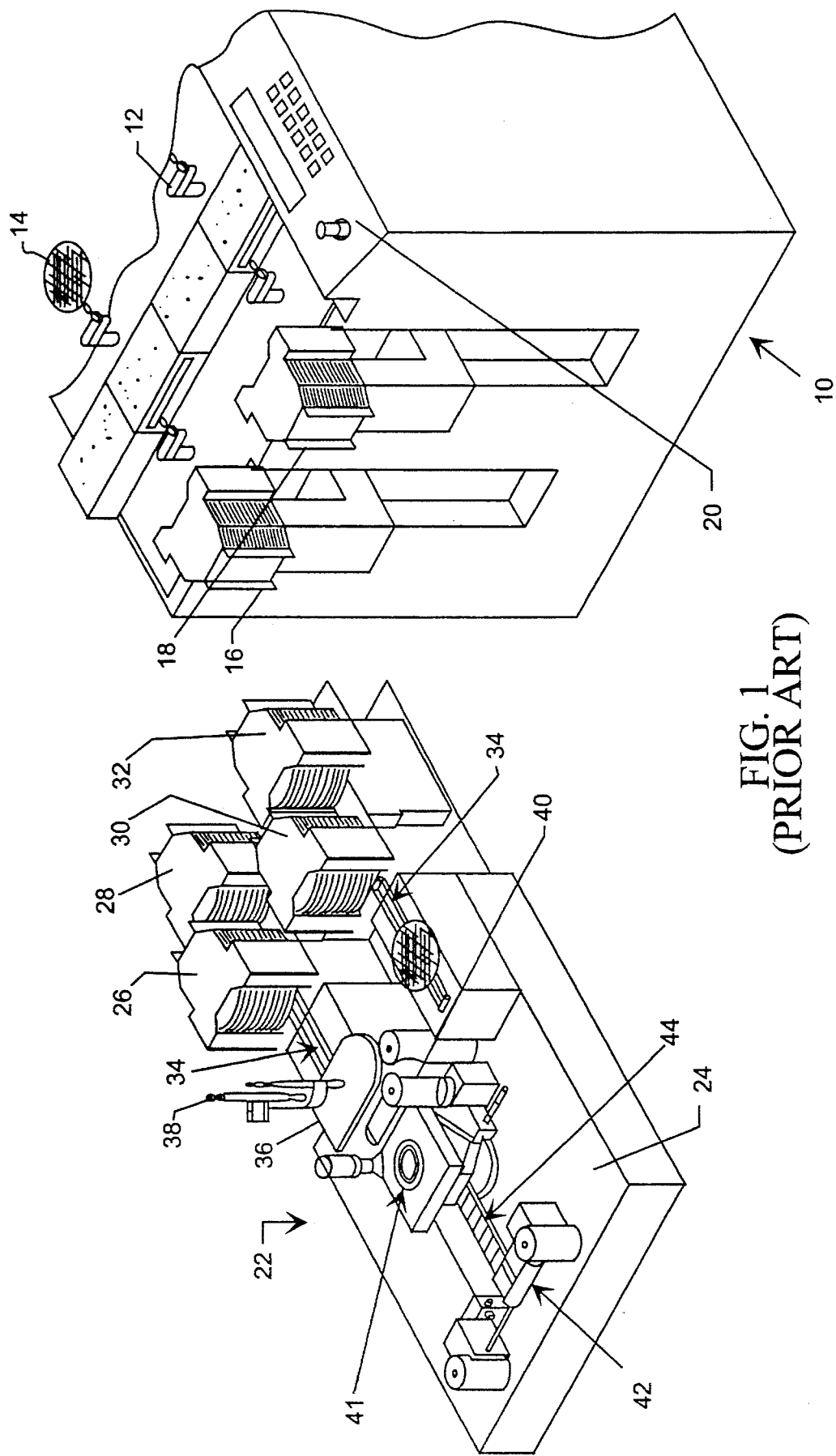
FIG. 1 is an elevational view of a non-integrated stepper and a coater/developer according to a prior design.
Figure 2:
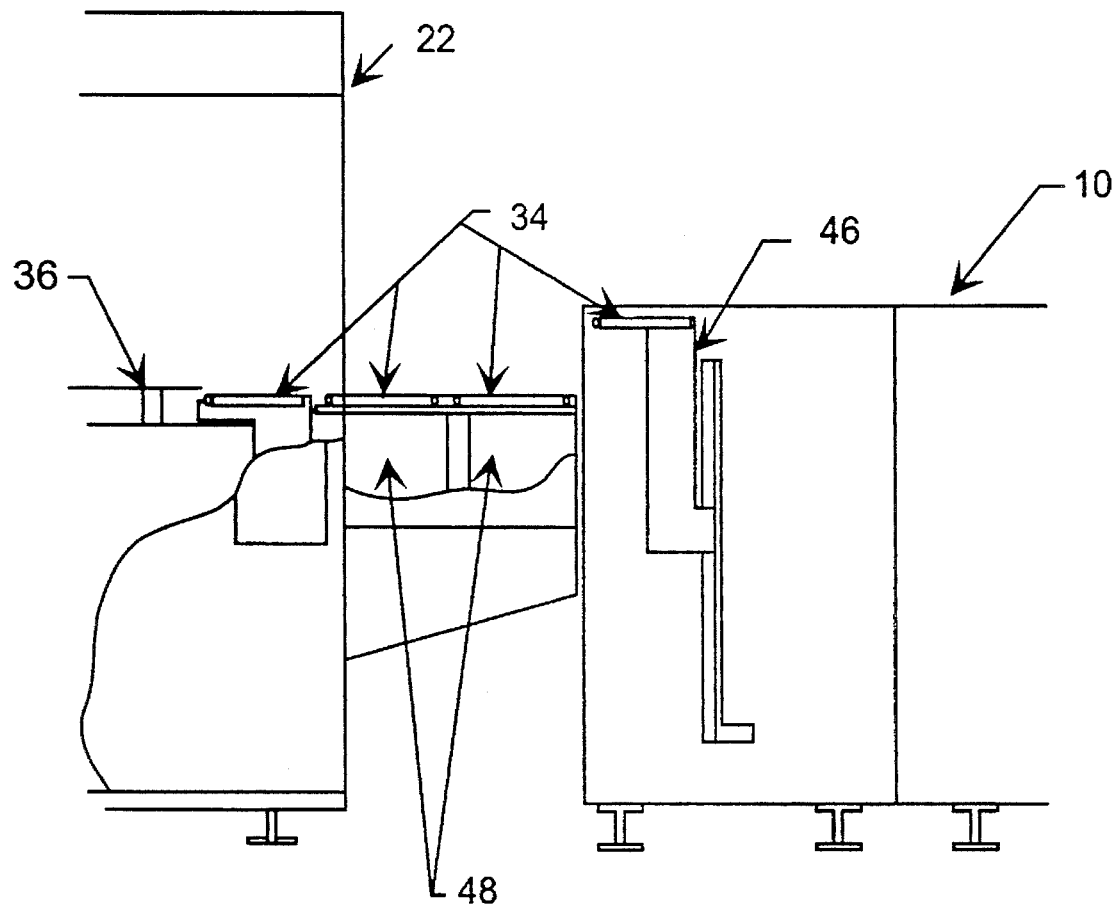
FIG. 2 is a side elevational view of a lateral feeder integrated between a stepper and a coater/developer according to a prior design.
Figure 3:
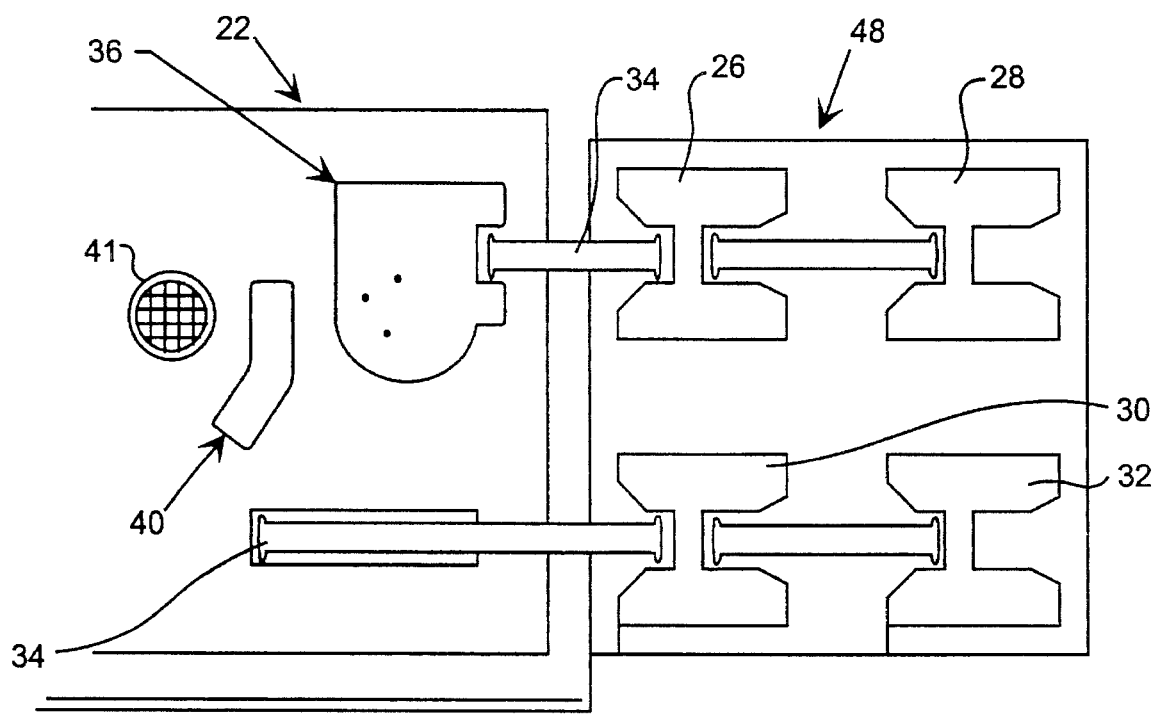
FIG. 3 is a top plan view of a lateral feeder placed adjacent to a stepper according to a prior design.

While the invention is susceptible to various modifications and alternative forms, specific embodiments thereof are shown by way of example in the drawings and will herein be described in detail. It should be understood, however, the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 4:
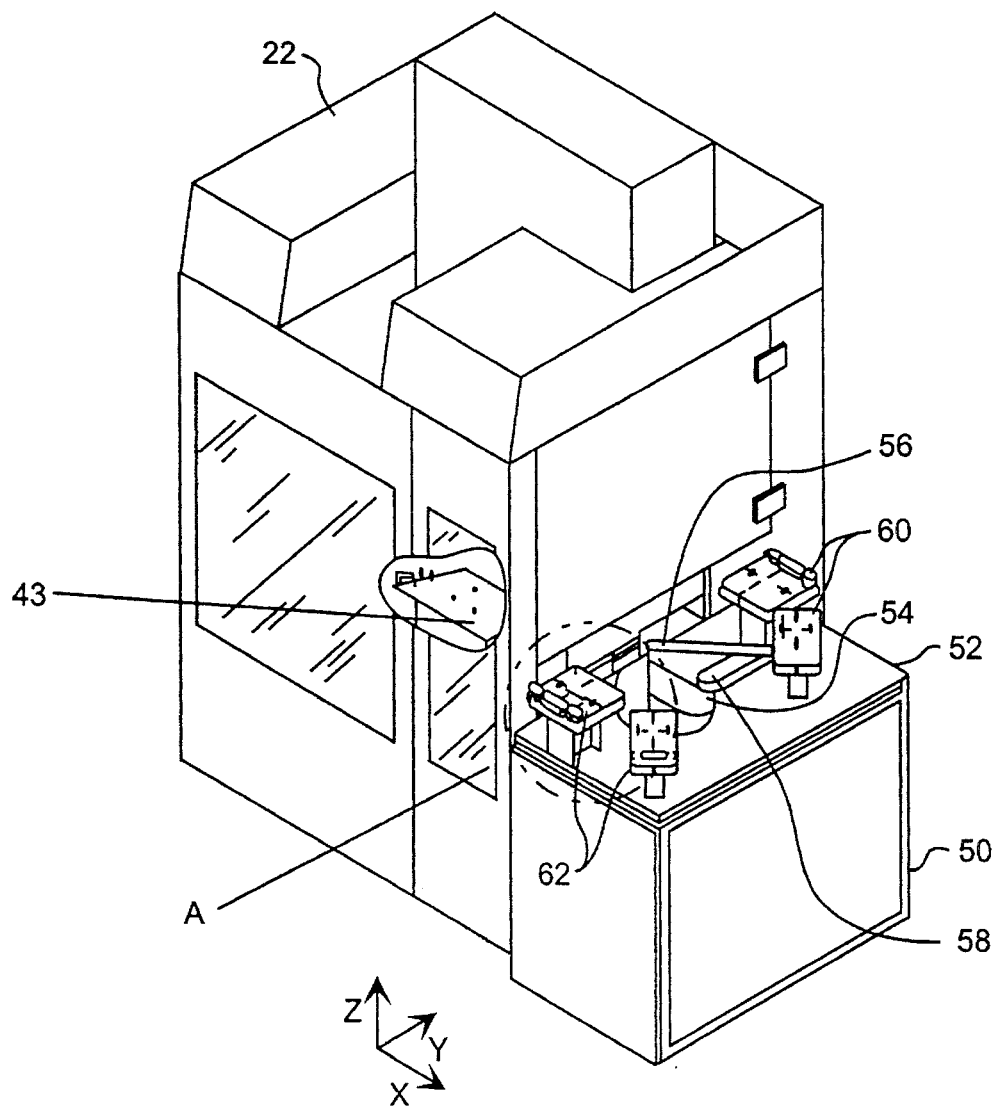
FIG. 4 is a perspective view of a stepper placed adjacent to a robotic interface unit according to the present invention.

Turning now to the drawings, FIG. 4 illustrates a robotic interface unit 50 placed adjacent to and coupled to stepper unit 22. It is understood that interface unit can be retrofitted with any existing stepper 22 provided various modifications to hardware and software are made. Specifically, stepper 22 of conventional design includes lateral feeders 48 as described above. Each lateral feeder having associated drivers which move conveyor belts according to an input signal sent from stepper 22. The drivers, conveyor belts and all related hardware associated with previous lateral feeders can be replaced or retrofitted according to the present invention with new drivers and related hardware associated with interface unit 50. Therein, interface unit 50 can replace conventional lateral feeders resulting in an improved method of feeding and receiving wafers using existing stepper 22. Used merely as an example, a suitable stepper 22, such as a PAS model 2500 and/or 5000 series stepper manufactured by ASM Lithography BV of Veldhoven, The Netherlands, can be used. ASM steppers can thereby be retrofitted with interface unit 50 as an exemplary embodiment of the present invention. Associated with many conventional ASM steppers are lateral feeders which move wafers into and out of the stepper. Lateral feeders are well known, a suitable one obtainable from CYBEQS Corp., of Menlo Park, Calif., model no. 2660. CYBEQS lateral feeders utilize conventional conveyor belts 34 as described above. The CYBEQS can be replaced and retrofitted with robotic interface unit 50 of the present invention. All necessary hardware and software interface for performing retrofit using ASM steppers and CYBEQS feeders are described hereinbelow as an exemplary embodiment. It is to be understood, however, that other types of steppers can be retrofitted and other types of lateral feeders can be replaced. Particularly, lateral feeders other than CYBEQS can be replaced and retrofitted upon a generic stepper in accordance with the present invention using inherent, slight modifications to the exemplary embodiment described herein.

Further shown in FIG. 4 is a base plate 52 upon which a robotic assembly 54 is placed. Assembly 54 includes a robotic arm 56 which is moveable in three dimensions, along the X, Y and/or Z axis. A suitable robotic assembly may be purchased from Genmark Automation, Inc., of Sunnyvale, Calif., model no. Gencobot IV. The robotic assembly functions by moving arm 56 vertically along a Z-axis by up and down movement of assembly 54. Furthermore, assembly 54 can rotate within the X-Y plane causing arm 56 to reciprocate. Still further, arm 56 can pivot about a primary arm 58 causing arm 56 to extend radially outward along the X and Y axis. The upper surface of robotic arm 56 is substantially planer and is adapted for lifting a wafer near its center backplane and moving the wafer, for example, onto an indent portion of p-chuck 36 such that after arm 56 releases the wafer, it can be subsequently air driven onto the p-chuck upper surface. After coarse positioning, three p-chuck pins can then be pneumatically elevated from the p-chuck upper surface to allow a space between the wafer and the p-chuck in order that dipod 40 can be positioned under the wafer. Vacuum on dipod 40 is then activated as the p-chuck pins are lowered thereby completing transfer of the wafer from p-chuck 36 to dipod 40. Thereafter, dipod 40 is rotated to bring the wafer over the surface of e-chuck 41 and supported on extendable pins extending from the upper surface of the e-chuck. The e-chuck pins may then be lowered allowing the wafer to be held by vacuum for exposure. After exposure, e-chuck pins are raised along with the wafer and dipod 40 is rotated underneath the wafer, between the wafer and the e-chuck. The e-chuck pins can then be lowered allowing complete support on dipod 40 and subsequent movement of the wafer to the support prongs of drop off station 43. Dipod 40 then moves back to home position allowing arm 56 to extend under the prong-supported wafer. Arm 56 can then be elevated to complete the transfer from drop off station 43 to the upper surface of arm 56.

Figure 5:
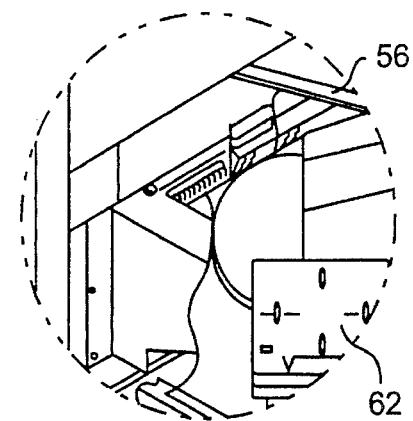
FIG. 5 is a detailed view of area A shown in FIG. 4.

FIG. 5 is a detail view of robotic arm 56 extended within stepper 22 to receive a wafer thereon. After the wafers are transferred from feed locations 50, to p-chuck 36, to e-chuck 41, and to drop off station 43, the exposed wafers are then removed from drop off station 43 via robotic arm 56 and placed upon one of two wafer discharge locations 62. Each wafer feed and discharge location is adapted to receive a cassette containing a plurality of wafers. The locations can be varied in size depending upon the size of wafers and corresponding cassette size. Generally speaking, wafer cassettes are well known in the art and are useable throughout the wafer fab area. Wafer cassettes can be physically moved from one location and placed at another location by an operator. An operator may, for example, move a cassette from one fabrication device and place that cassette, containing processed wafers, at the feed locations 60. The operator may also transfer cassettes from the wafer discharge locations to a remote wafer fabrication device. As such, the stand-alone stepper 22, having interface unit 50 coupled adjacent thereto, can be used merely to place wafers from feed and discharge locations into and out of stepper 22 via robotic arm 56.

Figure 6:
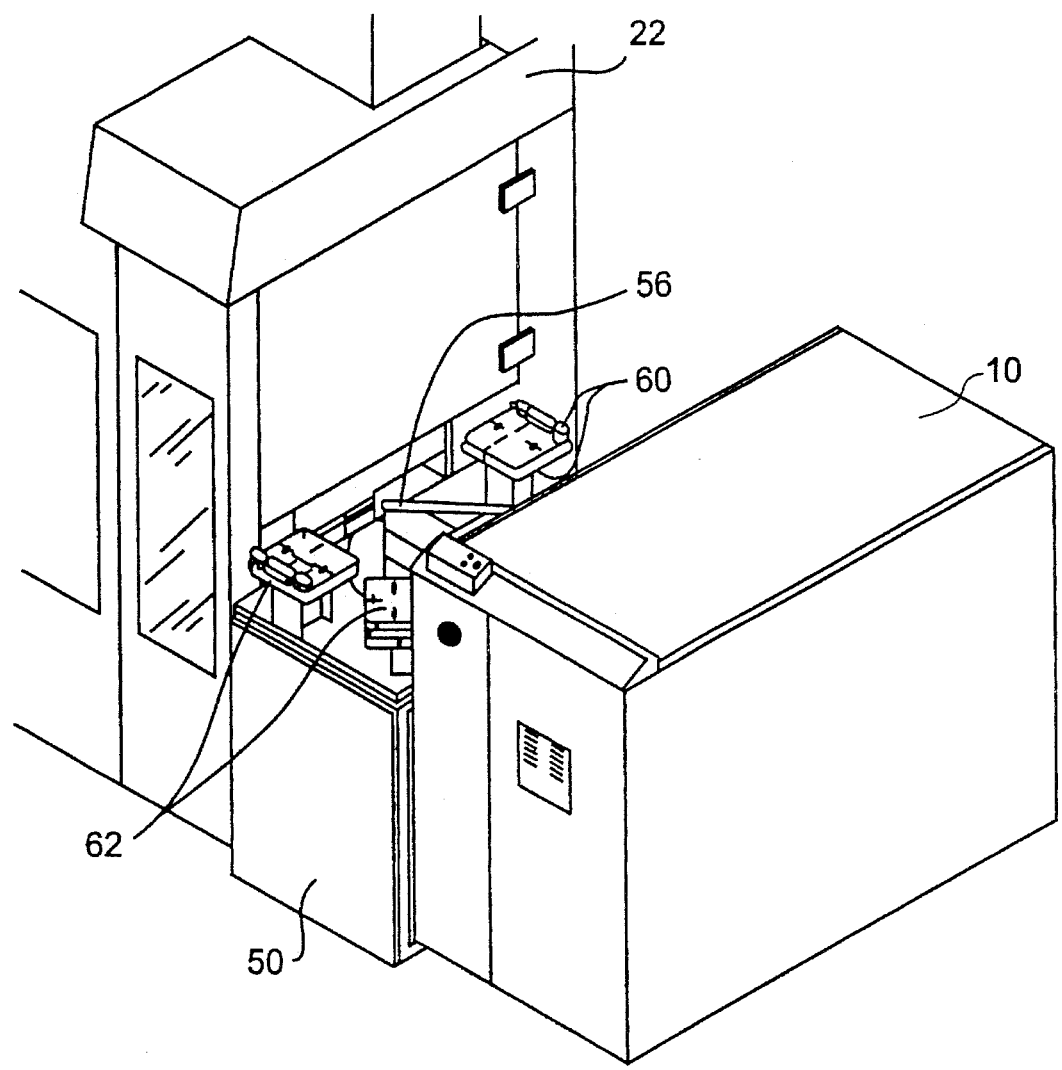
FIG. 6 is a perspective view of a robotic interface unit coupled between a stepper and a coater/developer to form an integrated wafer processing system according to the present invention.

Referring to FIG. 6, an integrated system is shown capable of transferring wafers between coater/developer 10 and stepper 22. As such, wafers are automatically transferred via interface unit 50 without the need for an operator physically moving cassettes and associated wafers between the units. As such, FIG. 6 illustrates an automatic system for transferring wafers between fabrication units and tracking wafers as they are being transferred. Each wafer can be electronically monitored to determine its turn within the processing system. Tracking of wafers is thereby important in ascertaining processing defects and possible causes for those defects. An integrated system thereby allows the operator to more easily track wafers processed not only in stepper 22 but in the coater/developer 10 as well.

Figure 7:
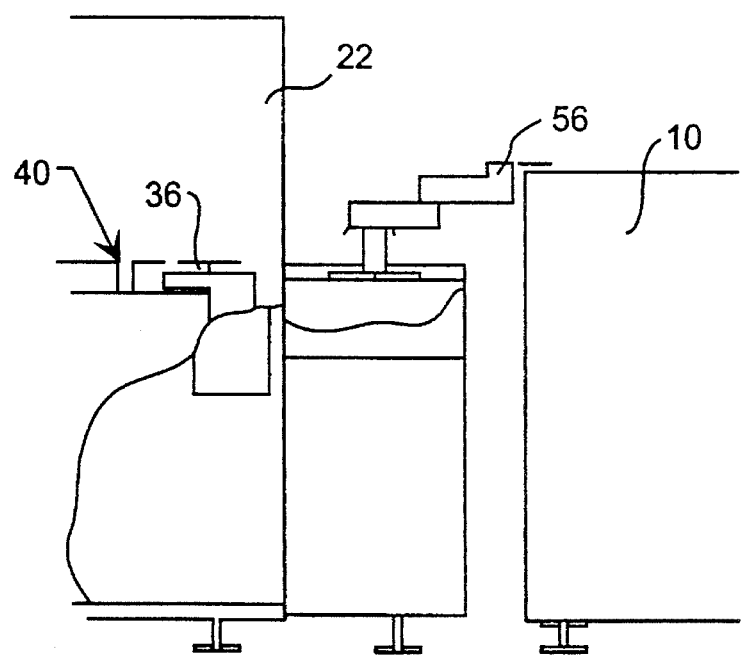
FIG. 7 is a side elevational view of a portion of the integrated system shown in FIG. 6.

FIG. 7 illustrates a side view with partial breakaway of the robotic interface system shown in FIG. 6. Arm 56 is shown extendable into the coater/developer 10 for receiving wafers placed at a pickup location near a termination point of one track within coater/developer 10. Alternatively, robotic arm 56 can be extended to drop off or discharge wafers onto a drop off location associated with another track of coater/developer 10. It is thereby appreciated that robotic arm 56 can be extendable in a wide perimeter into coater/developer 10 and stepper 22.

Figure 8:
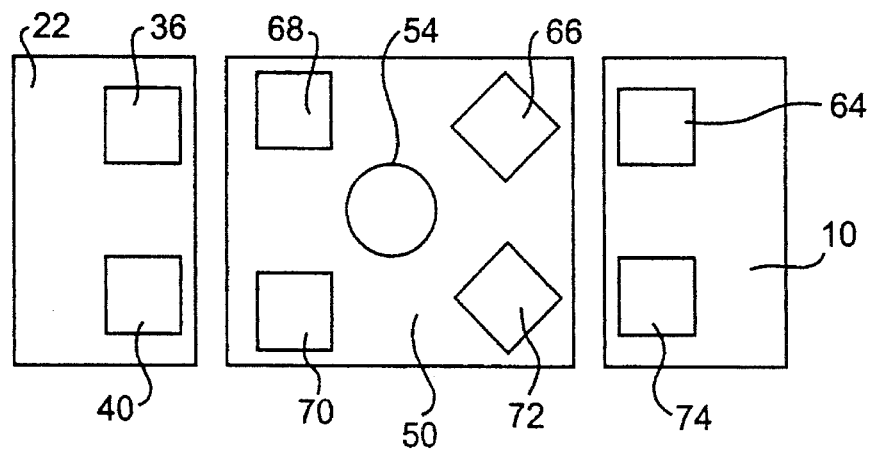
FIG. 8 is a top plan view illustrating a portion of the integrated system shown in FIG. 6.

FIG. 8 illustrates a top plan view of an integrated robotic interface unit shown in FIGS. 6 and 7. Robotic assembly 54 is capable of picking select wafers from a cassette containing a plurality of wafers at pick up location 64 of coater/developer 10. After a wafer is picked, it is then transferred to chuck 36. Robot 54 can also pick a wafer from a drop off location 43 and place that wafer at a respective from 70 or back 72 discharge location. Locations 66, 68, 70, and 72 can have cassettes placed thereon capable of receiving a plurality of wafers arranged in specific order. A space exists between wafers placed within each cassette for allowing arm 56 to extend within the space and against the backside surface of a selected wafer. Locations 36 and 40 are not adapted to receive cassettes since processing within stepper 22 is on an individual wafer basis. Similarly, locations 64 and 74 are also single wafer locations. The termination and origination point of each track can have a wafer which is received or placed by robot assembly 54. One or more select wafers can be drawn or placed from each cassette onto at least one wafer storage location (i.e., locations 66, 68, 70 and 72) associated with interface unit 50.

Figure 9:
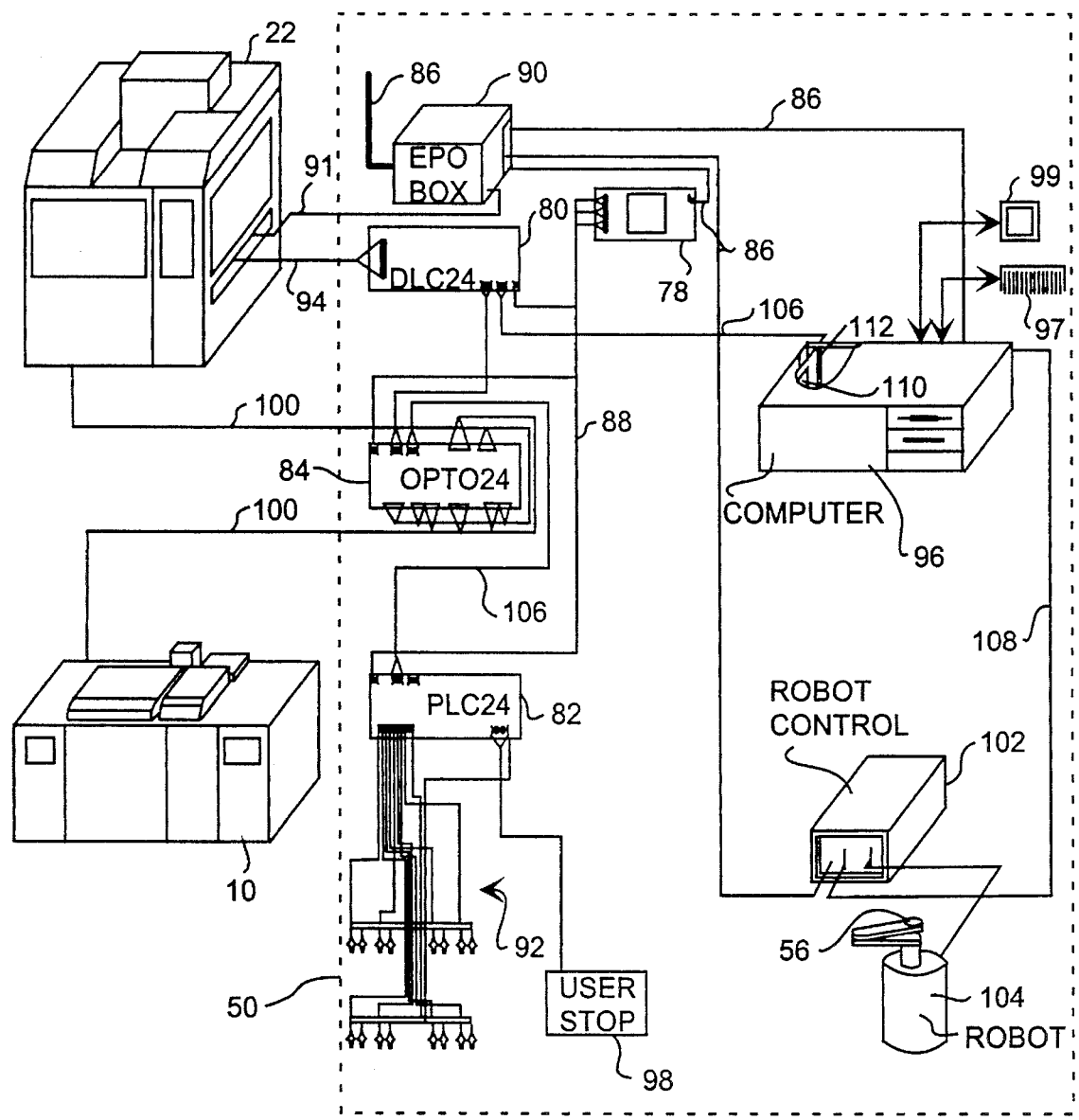
FIG. 9 is a block diagram of a robotic interface unit integrated between a stepper and a coater/developer according to the present invention.

Referring now to FIG. 9, a block diagram is shown of hardware associated with robotic interface unit 50. Interface unit 50 includes a power distribution system 78 which provides power to interface unit 50. System 78 includes a power monitor associated with stepper 22, a central power switch and power supplies for digital logic controller 80, programmable logic controller 82 and opto-controlled logic controller 84. A suitable power distribution system 78 can be purchased as model no. OFB5-25, from PicoElectronics, Inc., located at Mt. Vernon, N.Y. System 78 provides two power sources: a standard 120 v AC using standard outlets, and 12 v DC for each module 80, 82 and 84. 120 v AC is shown by reference numeral 86, and 12 v DC power is shown by reference numeral 88. System 78 monitors the power to interface unit 50 with a two wire connection to an emergency power off (EPO) box 90. EPO box 90 is associated with a CYBEQS power connector model no. 2660 of conventional art. As such, unit 50 is retrofittable in place of a CYBEQS lateral feeder 48 as described above. Leading from EPO box 90 is another wire 91 connected to stepper 22 15 v power supply. The second wire is connected to stepper ground. When the stepper's power is turned on normally or with the stepper's EPO switch imprint, power distribution system 78 cuts power to interface unit 50. Power distribution 78 will return power to interface unit 50 when stepper 22 power is restored. Interface unit 50 contains interface modules 80, 82, and 84 as described above.

Digital logic controller 80, or DLC 24, communicates with stepper 22 over a minibus cable 94 which connects stepper 22 to the replaced or retrofitted CYBEQ unit/steppers. Thus, the cable normally interfacing lateral feeder 48 can be unplugged from that feeder and directly plugged into DLC 24. When stepper 22 sends a command, DLC 24 reads the command and sends it to computer 96. DLC 24 also emmulates CYBEQ's status information which stepper 22 requires.

Programmable logic controller 82, designated as PLC 24, monitors the status of sensors 92 of each cassette placed at locations 64–76, described above. PLC 24 also monitors the status of the user-stop switch 98 and sets the lights on the user-stop switch based on information sent by computer 96.

Opto-coupled logic controller 84, denoted as OPTO 24, reads the signals on stepper - coater/developer interface cable 100 and makes them available to computer 96. OPTO 24 changes the signals on interface line 100 based on input from computer 96.

Interface unit 50 also includes a robot controller 102. A suitable controller is a Gencobot IV, 17" robot controller manufactured by Genmark Automation of Sunnyvale, Calif. Interface unit 50 also utilizes a Gencobot robot 104 with an upper arm 56 for transferring wafers to and from stepper 22.

Computer 96 provides all central processing functions for interface unit 50, and also provides operation of the entire robotic interface system. Computer 96 runs programs stored within the computer memory, and also controls the hardware components of the robotic interface system. Computer 96 communicates with the interface modules 80, 82 and 84 over an RS 485 local area network (LAN), commonly called an ANET. RS 485 is a widely used interface bus, standard in the industry as identified by the Electronic Industries Association (EIA). RS 485 provides communication between equipment via a twisted pair of conductors of common design. ANET uses a master/slave (or server-based) networking scheme with standard communication protocol using a packetized data transferal for information transfer of variable length. ANET cable 106 is shown coupled between computer 96 and interface modules 80, 82 and 84. Computer 96 also communicates with robot controller 102 by sending and receiving ASCII commands over a RS 232 serial link 108. RS 232 serial link is well known as an industry standard communication system set forth by EIA described above. ANET master node, located inside computer 96 is responsible for performing all LAN communication. The ANET master node is a daughter board 110 located on data translation interface (DTIF) board 112. DTIF board 112 can be obtained from Data Translation, Inc., of Marlboro, Mass., part no. DT2806. DT2806 is a general purpose printed circuit board (PCB) which allows communication interface directly to an XT/AT communication bus. DTIF daughter PCB is a custom PCB designed to allow interface between the XT/AT communication bus and the ANET slave node modules.

A broad overview of the software theory of operation begins by making clear that interface unit 50 can be used to retrofit or replace any lateral feeder. However, the exemplary embodiment illustrated in FIG. 9 is best suited for retrofitability into a CYBEQ model 2660 indexers by emulating the CYBEQ's model 2660 indexers. Emulation is achieved by converting commands sent by the stepper 22 to commands that control the wafer handling robot 104. The controller program supports wafer transfer between the cassettes and stepper 22, or between coater/developer 10 and stepper 22. As such, the robot controller program which is run within computer 96 performs many tasks including communications with modules 80, 82 and 84 via ANET. Furthermore, controller program modifies signals on the stepper-coater/developer interface cable 100 and converts stepper 22 commands into robot commands. Still further, robot controller program controls the wafer handling robot via serial interface 108 and provides emulated CYBEQ status information to stepper 22. Still further, robot controller program monitors cassette sensors 92 and user-stop switch status 98 and scans cassettes and creates wafer maps. Suitable sensors 92 can be obtained from OPTEK Technology, Inc., located at Carrolton, Tex., model no. OPB901W55, and suitable user stop switch can be obtained from G. C. Electronics, located at Woodside, N.Y., model no. 35-681. Still further, robot controller program executes user commands to interface with robot controller 102 according to a customized pick and place routine necessary to carry out the above actions concurrently. The robot controller program pulls each task from a main routine and determines if the task is ready to begin or continue execution, or if the task is still waiting for a condition to be met. A main loop continues to the next task. If the task is ready for execution, the controller program takes the necessary actions.

Figure 10A:
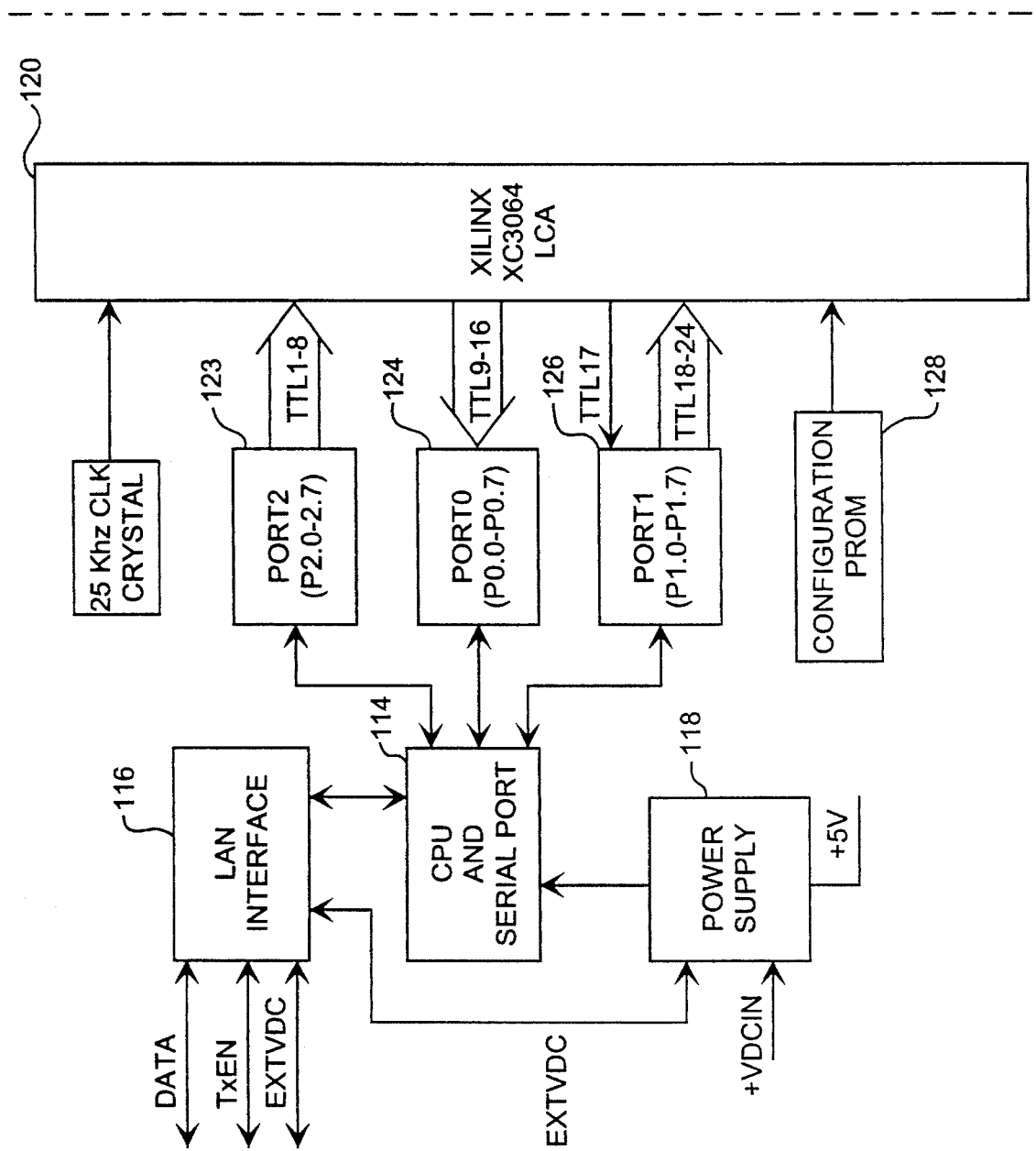
FIG. 10 is a block diagram of a digital logic controller according to the present invention.
Figure 10B:
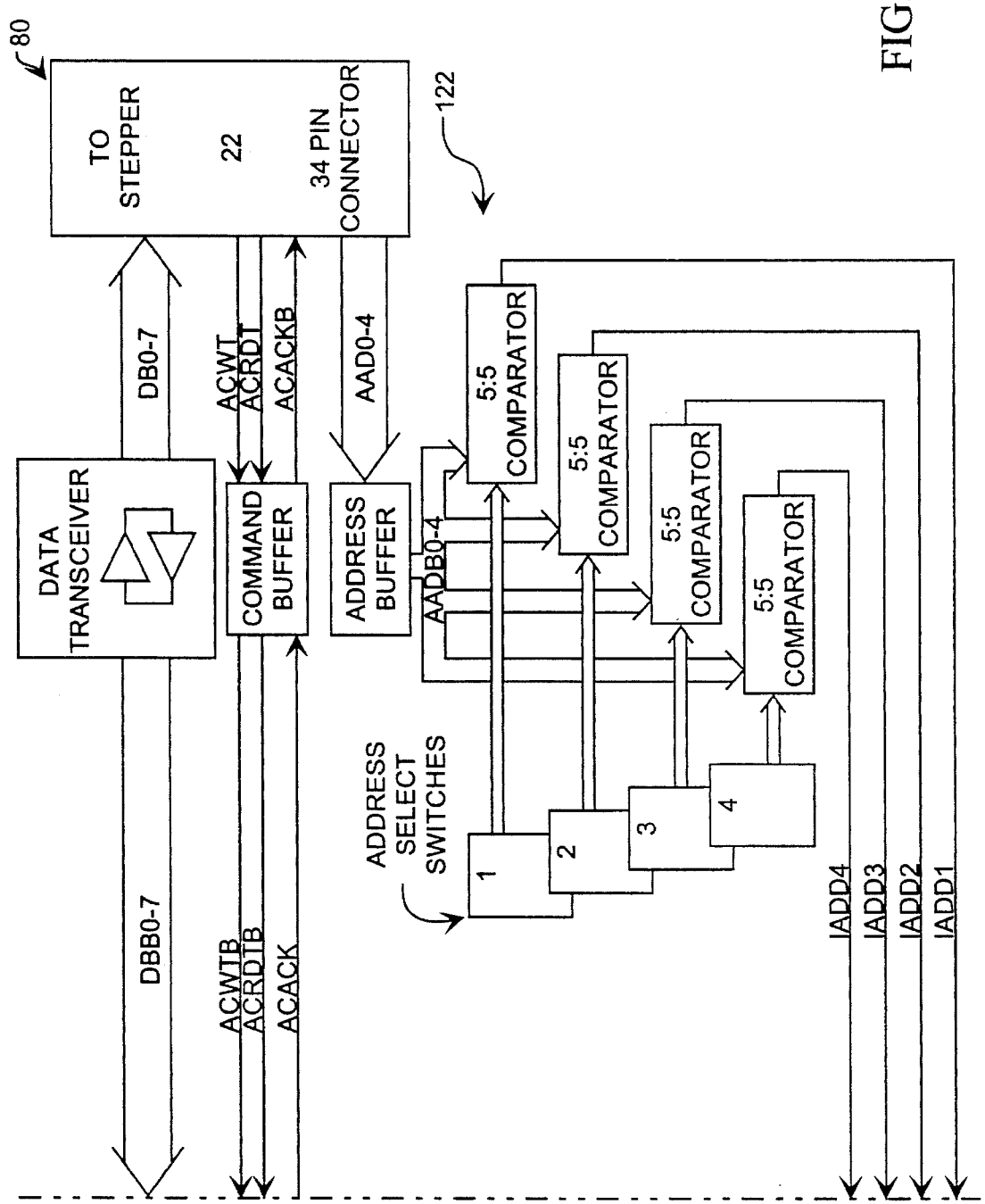

A more detailed description of the hardware necessary for performing DLC24 operation is illustrated in FIG. 10. DLC24, designated as reference 80, provides a high-speed interface to mini bus cable 94 by emulating, e.g., the original CYBEQ model no. 2660 indexers. DLC24 consists of a microprocessor 114, a suitable microprocessor being model no. DS5000 microprocessor manufactured by Dallas Semiconductor, Inc. of Dallas, Tex. Microprocessor 114 may incorporate a micro controller, model no. 8051, manufactured by Intel Corp. located in Santa Clara, Calif. The micro controller may have 32K of battery-backed static RAM a watchdog timer and a security system for application code. A set of RS485 drivers provide an ANET network interface 116. The drivers are connected to a built-in serial port on CPU 114. DLC24 communicates with computer 96 over DATA, TxEN, and EXTVDC LAN interface. Power supply 118 powers both LAN interface 116 and microprocessor 114. Power supply 118 receives its power and cut-off power from power distribution system 78 via EPO box 90. A logic cell array (LCA) 120 obtainable from Xilinx Corp. of San Jose, Calif., model no. 3064 can be used within DLC24 as shown. Xilinx LCA 120 provides an interface between microprocessor 114 and stepper 22 via mini bus cable 94. Xilinx LCA generates the necessary control signals and data in response to requests by stepper 22. Internally, Xilinx LCA 120 is configured to have four address register lines and a read/write acknowledge pulse generator input as shown. Each address has two associated status latches and one command latch. Xilinx LCA 120 responds to stepper 22 commands and status requests and provides control timing. LCA 120 control program resides in a single serial PROM on DLC24 PCB. LCA 120 control program loads when power is applied to DLC24, or when microprocessor 114 firmware is reset. The robot controller program can request a soft reset, which causes Xilinx LCA to re-load its firmware. Microprocessor 114 controls the flow of data to and from Xilinx LCA 120 and provides an RS485 ANET LAN interface. Microprocessor control program takes stepper 22 commands from Xilinx 120 and makes them available to computer 96 via ANET. Microprocessor control program also stores simulated CYBEQ status words in the Xilinx registers so that stepper 22 can access them immediately. The interface hardware on DLC24 provides the interface between mini bus cable 94 and Xilinx LCA 120. The magnitude comparators 122 in the interface hardware decodes addresses (AAD0–4) sent from stepper 22 and provides select address pulses (IADD1–4) to Xilinx 120.

FIG. 10 is a block diagram showing some general interconnections associated with micro controller registers. The registers receive data and send data via Port 0–2. Port 0 of the DS5000 is used to read command information from the LCA 120. Port 1 is used to write status information to the LCA 120. Port 2 is used for the control lines and the address lines located between the DS5000 and the LCA 120.

Figure 11:
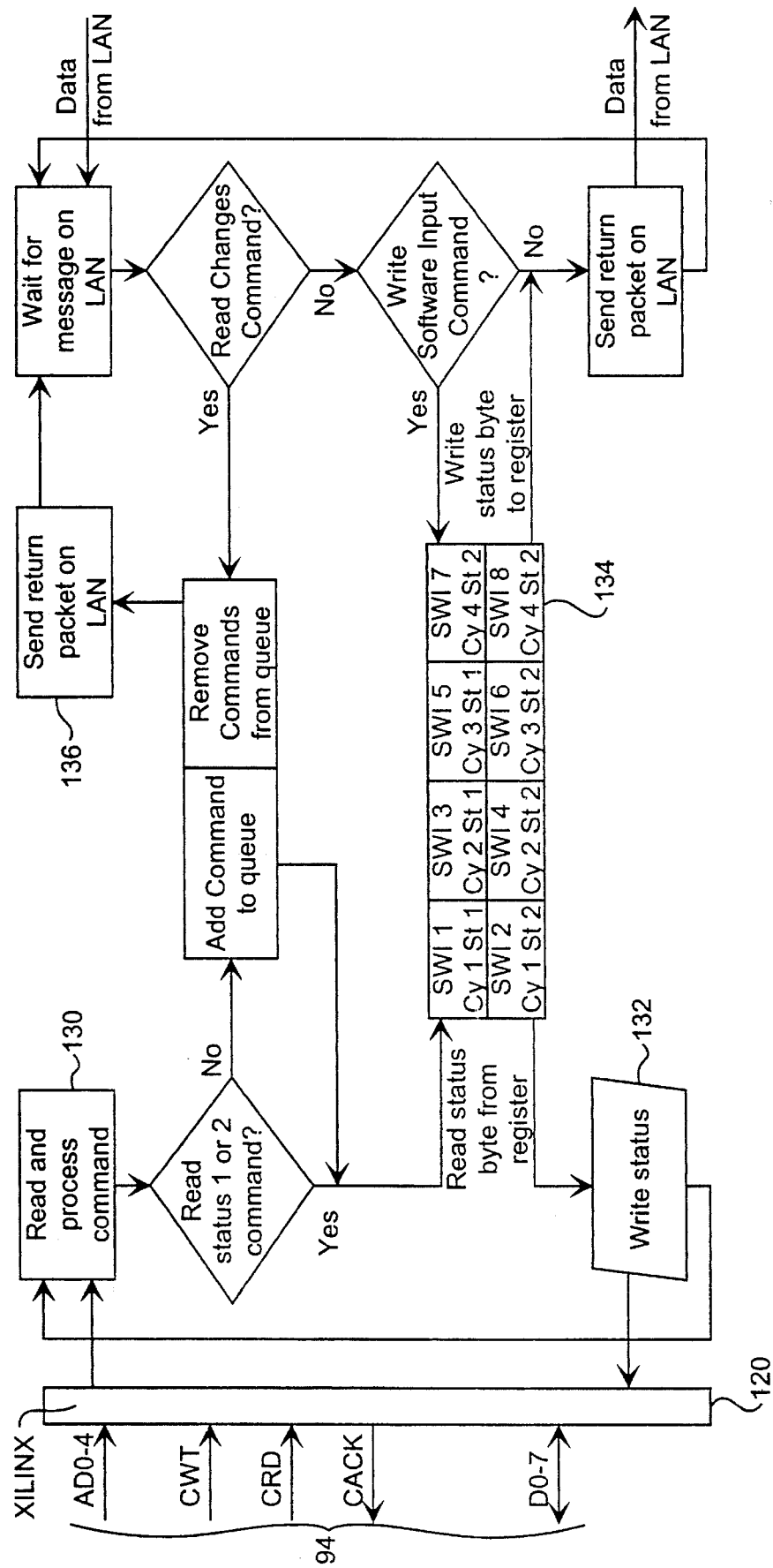
FIG. 11 is an operation flow diagram of the digital logic controller as shown in FIG. 10.

Referring now to FIG. 11, LCA 120 is shown capable of receiving commands (AD0–4, CWT, CRD, CACK and D0–7) from stepper 22 over mini bus cable 94. The following table I lists the various signals sent over mini bus cable 94 and their meaning.

TABLE I

| SIGNAL NAME | DESCRIPTION |
| --- | --- |
| AD0–AD4 | Five address lines used to select the CYBEQ number |
| D0–D7 | Eight data lines to transmit one byte of data |
| CWT | Command write signal from stepper |
| CRD | Command read signal from stepper |
| CACK | Command acknowledge from CYBEQ |
| GND | Ground (on 18 wires) |

Stepper 22 can perform two operations involving Xilinx LCA 120. The first operation includes writing commands and the second operation includes reading status registers. To issue a command, stepper 22 places the command on D0–7 and the address on AD0–4. Stepper 22 asserts CWT to notify the Xilinx LCA 120 that it has written a command. The Xilinx 120 responds by reading the command and, after a certain delay, preferably 140 μs delay briefly asserts CACK to indicate that it has received the commands. The LCA 120 stores the command in an internal command register so that microprocessor 114 firmware can access it. To read status registers, stepper 22 writes a "read status" command. given the procedure described in the previous paragraph. Stepper 22 then places the address on AD04 and asserts CRD. LCA 120 responds by placing the contents of the specified address status register on to the data bus. LCA 120 asserts CACK after approximately 40 μs delay, which indicates that the data is valid and is ready to be read. Xilinx LCA 120 is connected to microprocessor 114 through three parallel ports, designated in FIG. 10 as 123, 124 and 126. One port sends command data, one sends status data, and one sends control signals. To avoid conflict with stepper 22, microprocessor 114 verifies that the IBUSY flag is not asserted before it reads from or writes to Xilinx 120. Microprocessor 114 reads the command latches by asserting DSS0/1 and DCRD and reading the command byte via port 0 of microprocessor 114. Microprocessor 114 writes status bytes by placing the status on port 1 and asserting DSS0/1 and DCWRD. Microprocessor 114 can reset and reload LCA 120 firmware by asserting SWRST, which will place Xilinx 120 into "program load" mode. LCA 120 will read the configuration data from serial PROM 128.

The firmware in microprocessor 114 reads from and writes to registers on Xilinx 120. Xilinx 120 communicates with stepper 22 over mini bus 94 by emulating the CYBEQ. The firmware sends stepper 22 commands to computer 96 which processes them. Computer 96 sends status information back to DLC24 which makes it available to stepper 22. Microprocessor 114 runs a custom program illustrated in the appendix (incorporated herein by reference) to send and receive command and status information from Xilinx 120. The custom program cycles through four sets of registers on Xilinx 120 in a "round robin" polling loop. Each set of registers represents a CYBEQ indexer.

As shown in FIG. 11, Xilinx 120 allows DLC24 to read and process commands as shown in block 130 as well as writing status commands as shown in block 132. If status 1 or 2 command is read, then status bytes are correspondingly read from their registers 1 through 8 as shown by reference 134. However, if read status 1 or 2 commands are not read, then a command is added to the queue before status bytes are read from register. Additionally, status commands and be removed from queue and a return packet sent to LAN as shown by block 136. Data can be received from LAN or sent to LAN, and data can be written in or read from registers 134 according to the logic flow diagram shown in FIG. 11. FIG. 11 illustrates all the data paths associated with LCA 120 and DLC 24. Xilinx LCA 120 handles the CYBEQ address AD0–4, and also uses the Data B (DB0–7). CACK is the CYBEQ acknowledge; CRD is the CYBEQ read; and CWT is the CYBEQ write commands sent from the retrofitted CYBEQ device. Block 130 is a routine which can be stored in the DLC firmware that reads the commands from stepper 22 and adds them to a command queue. Block 132 is another routine in the DLC 24 firmware that writes the eight status words to the Xilinx LCA registers where they can then be sent to stepper 22 via the LCA. Software input 1–8 (SWI1–8) indicate registers within DLC24 necessary to hold the status words . Cy1,St1–Cy4,St2 indicate the CYBEQ 1 status word 1 through CYBEQ 4 status word 2. On the left side of FIG. 11 are the LAN routines having two data messages possible: 1) read changes command and 2) write software input (SWI) commands. Various read changes commands are described in detail below.

Each register set within Xilinx 120 contains command register and two status registers. The firmware first checks IBUSY flag to confirm that the Xilinx 120 is not busy. Once Xilinx 120 is ready, the program writes the current status bytes into the two status registers of the Xilinx 120. After writing to the status registers, the firmware reads the command in the command registers and processes it.

Figure 12:
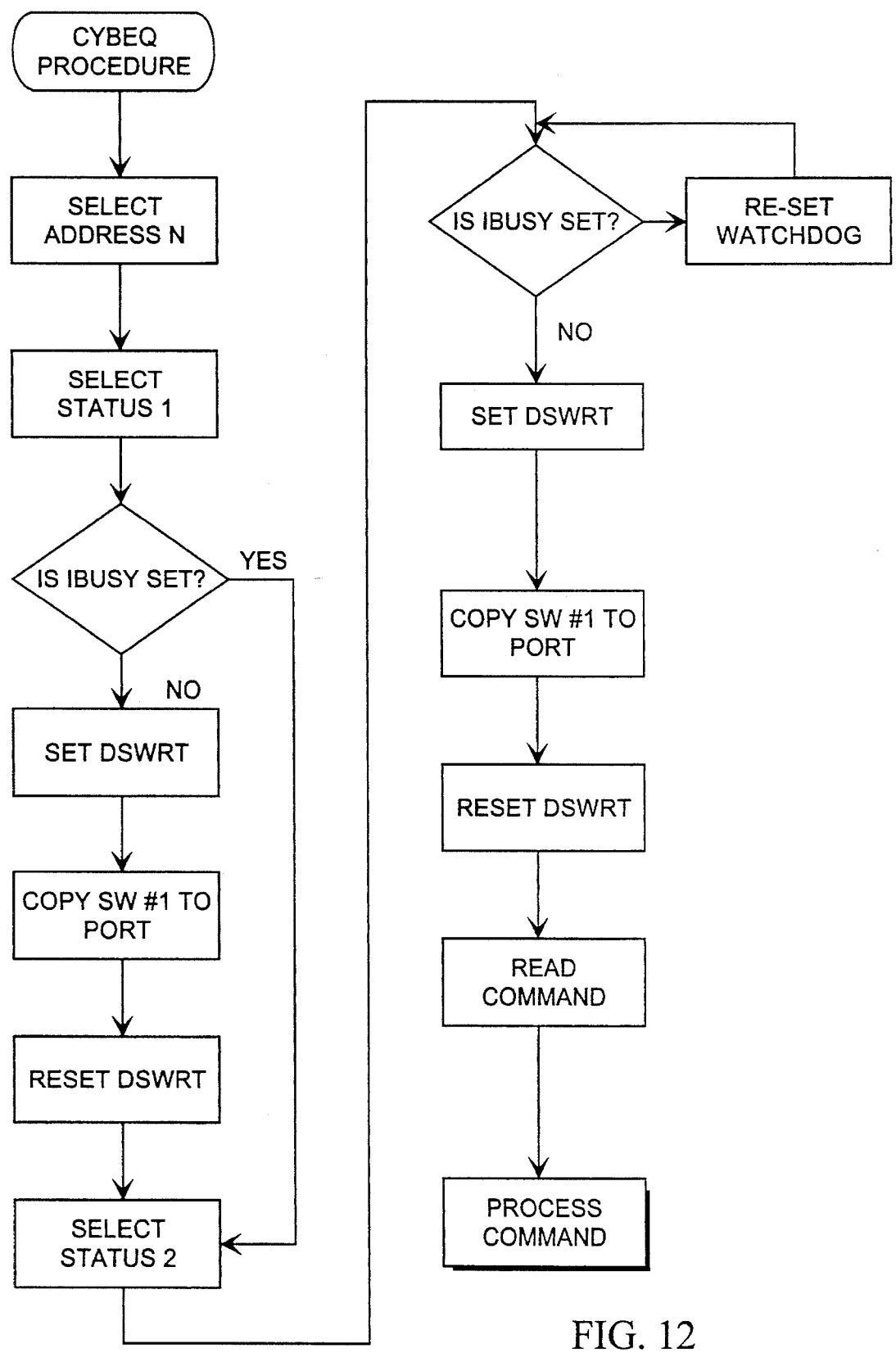
FIG. 12 is an operation flow diagram of a read/write operation of a Xilinx shown in FIG. 10 according to present invention.
Figure 13:
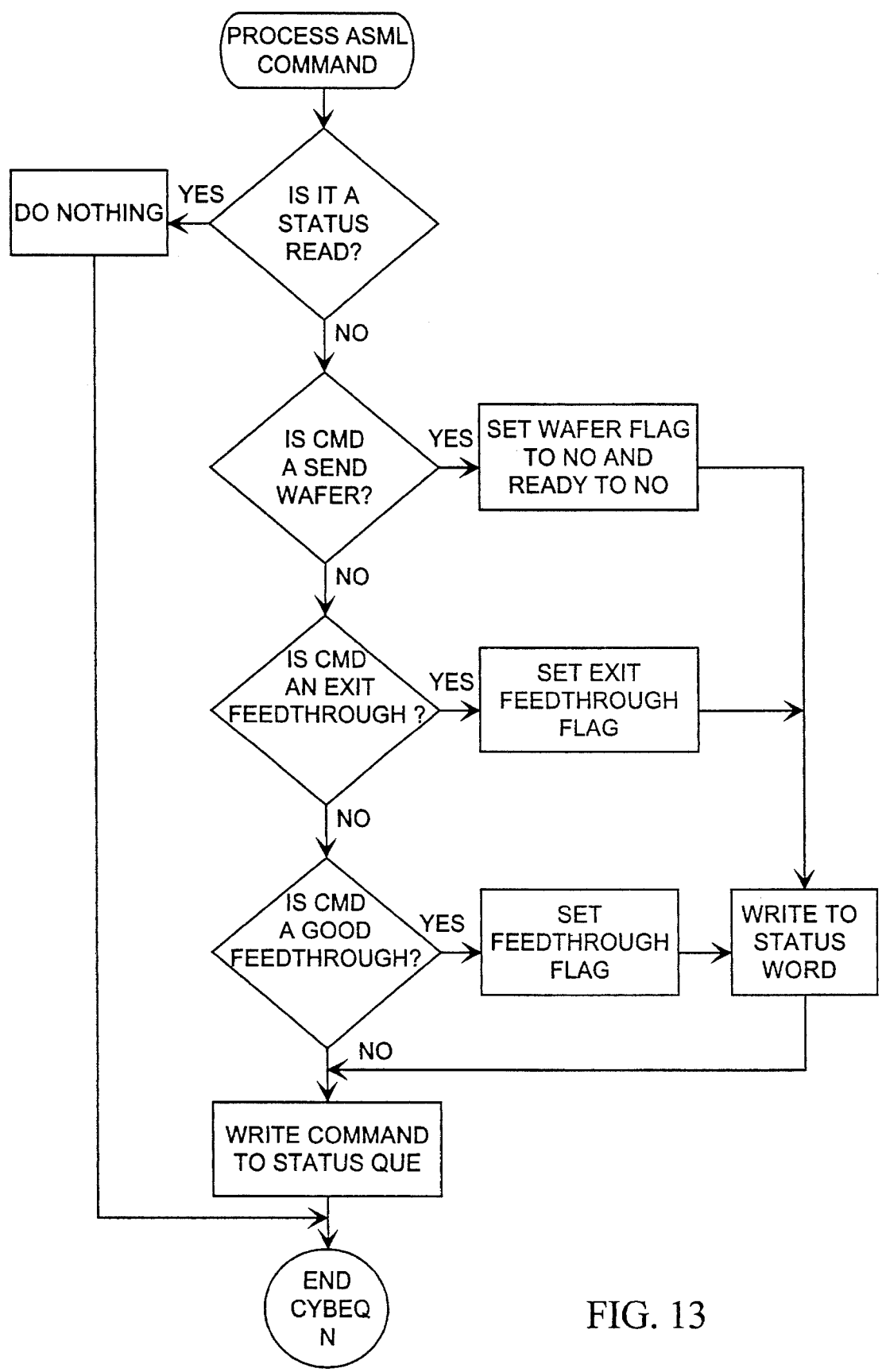
FIG. 13 is an operation flow diagram of a stepper command processing steps according to the present invention.

FIGS. 12 and 13 illustrate the logic flow of the CYBEQ emulation program of the present invention. FIG. 12 illustrates DLC24 routine for writing the status words to the Xilinx LCA. First, the routine sets the address N, where N is 1 through 4. Next, the routine points to status word 1. It checks to see if the Xilinx is busy (i.e., IBUSY). If it is not busy, the routine will set DSWRT, which is the DS5000 write pin. Next, it writes thte status data to the LCA. It does the same sequence for status word two and so forth for all four addresses.

FIG. 13 illustrates DLC24 firmware routine that reads a command for the Xilinx registers and puts the command in the write command status queue. The first step the routine performs is to select address 1 through 4. Next, it sets DSRD and then checks to see if the command is a read status command. If so, the routine does nothing. If the command is a send wafer command, then the routine sets the wafer flag to 0 and the status bits to the status words written to the Xilinx (see FIG. 12). If the command is an exit feed through or a goto feed through command, then the program sets the appropriate bit in the status words and writes the status words to the Xilinx LCA. The process is repeated for each address 1 through 4.

DLC24 communicates with robot controller 102 over the RS485 ANET LAN. DLC24 is programmed as an ANET slave node, computer 96 acts as the ANET master node. DLC24 and computer 96 communicate via the software input registers and status queues of 8 ANET nets. The following Table II lists the purpose of the registers in the eight nets used by the DLC.

TABLE II

| ANET NET # | INFORMATION IN THE SOFTWARE INPUT REGISTER | STATUS QUEUE |
| --- | --- | --- |
| 1 | CYBEQ one status word one | CYBEQ one commands |
| 2 | CYBEQ one status word two | CYBEQ two commands |
| 3 | CYBEQ two status word one | CYBEQ three commands |
| 4 | CYBEQ two status word two | CYBEQ four commands |
| 5 | CYBEQ three status word | |
| 6 | CYBEQ three status word | |
| 7 | CYBEQ four status word one | |
| 8 | CYBEQ four status word two | |

DLC24 maintains a 255-byte buffer, called the status queue, which stores pending stepper commands. DLC24 sends the entire contents of the appropriate status queue when computer 96 requests a stepper command. Computer 96 writes status information to DLC24 using ANET software input register. DLC24 uses the status information in the software input register to update Xilinx 120 status registers.

Figure 14:
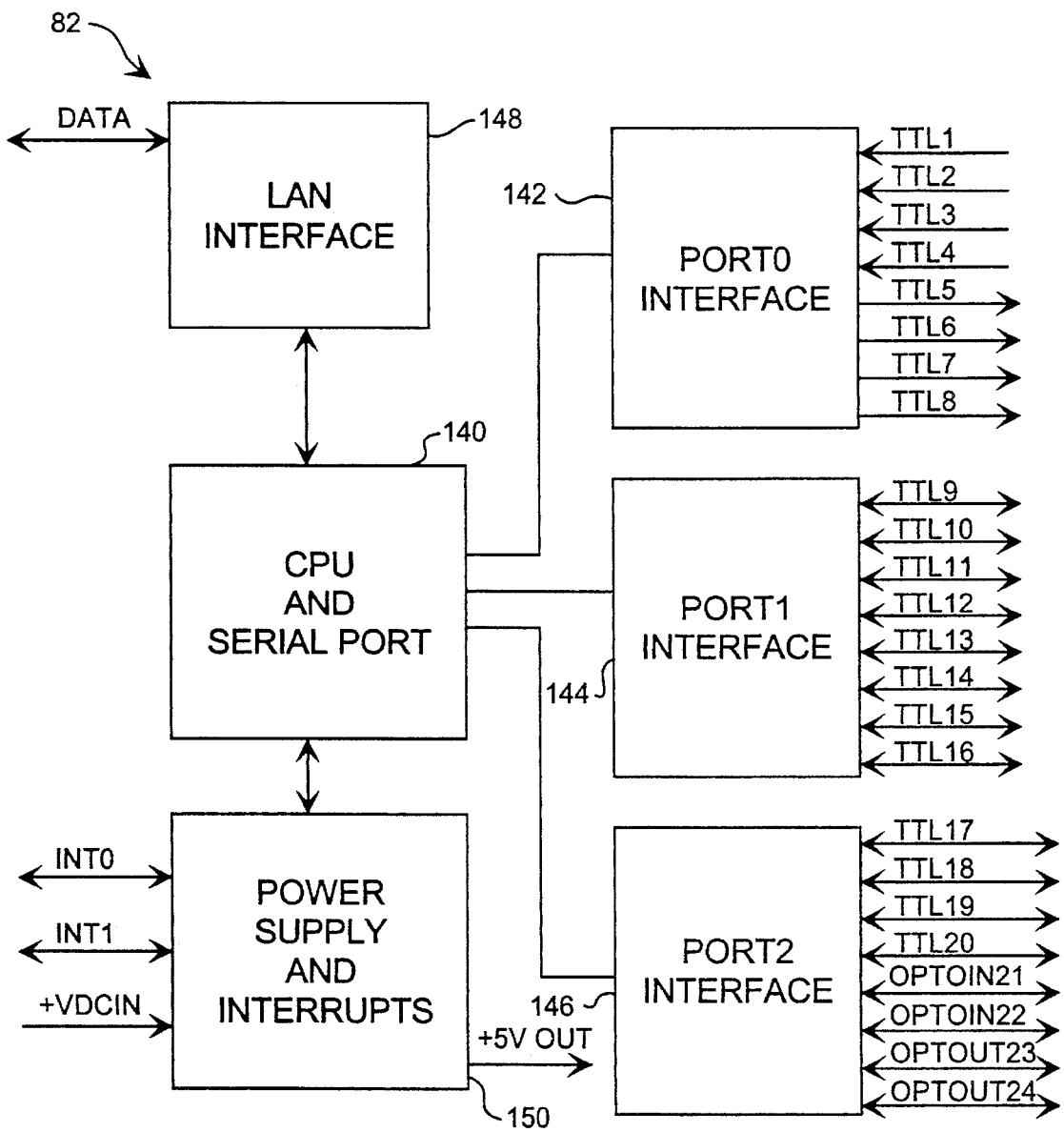
FIG. 14 is a block diagram of a programmable logic controller according to the present invention.

Referring now to FIG. 14, program logic controller 82 or PLC 24 is shown. PLC24 is a parallel digital control module with 24 I/O bits that can be remotely controlled or controlled by a built-in logic table. PLC24 module 82 and interface unit 50 monitors the status of sensors 92 and the user-stop switch 98. PLC24 also controls indicator lights on user-stop switch 98. User stop switch 98 allows the operator or user to stop, either temporarily or permanently, operation of interface unit 50 as well as stepper 22 and coater/developer 10. PLC24 consists of a microprocessor, preferably a model no. DS5000 microprocessor having a micro controller as described above. PLC24 also includes a set of RS485 drivers, 24 I/O bits and a TTL serial interface. A suitable microprocessor 140 is a model no. DS5000 having a micro controller, such as a 8051, described above. A status table in microprocessor 140 controls PLC24 reading and writing of status data. RS485 drivers provide an ANET network interface. The drivers are connected to a built-in serial port associated with microprocessor 140. PLC24 communicates with computer 96 via ANET LAN. PLC24 has 24 I/O bits. Twenty of the I/O bits are 5-volt TTL bits, which can be inputs or outputs. The remaining four bits consist of two opto-isolated inputs and two opto-isolated outputs as shown in FIG. 14. Three ports 142, 144, and 146 connect between the I/O bits and microprocessor 140. LAN interface 146 allows communication to ANET cable 106. Power supply and interrupt 150 is connected to power distribution system 78 and provides +5 v DC power to PLC24. As shown in FIG. 14, DATA is a bus capable of receive RS 485 communication, INT0 and INT1 are interrupts 0 and 1 connected directly to microprocessor 140, and VDCIN is a 12 volt input necessary for power supply 150 operation.

The following Table III lists the purpose of each I/O bit illustrated in FIG. 14.

TABLE III

| I/O BIT | PURPOSE |
| --- | --- |
| TTL 1 | Input from cassette number 1 sensor number 1 |
| TTL 2 | Input from cassette number 2 sensor number 1 |
| TTL 3 | Input from cassette number 3 sensor number 1 |
| TTL 4 | Input from cassette number 4 sensor number 1 |
| TTL 5 | Input from cassette number 1 sensor number 2 |
| TTL 6 | Input from cassette number 2 sensor number 2 |
| TTL 7 | Input from cassette number 3 sensor number 2 |
| TTL 8 | Input from cassette number 4 sensor number 2 |
| TTL 9 | Cassette number 1 status |
| TTL 10 | Cassette number 2 status |
| TTL 11 | Cassette number 3 status |
| TTL 12 | Cassette number 4 status |
| TTL 13 | Run light on/off |
| TTL 14 | Switch light on/off |
| TTL 15 | Pause light on/off |
| TTL 16 | Input from user-stop switch number 2 |
| TTL 17 | Run light on/off bit |
| TTL 18 | Switch light on/off bit |
| TTL 19 | Pause light on/off bit |
| TTL 20 | Input from user-stop switch number 1 |
| Opto input #1 | Reserved |
| Opto input #2 | Reserved |
| Opto output #1 | Reserved |
| Opto output #2 | Reserved |

The cassette sensors provide a 5 volt signal when a cassette is missed and a 0 volt signal when the cassette is present. The user-stop switch is set to 5 volts when the run position and 0 volts when in the pause position. PLC24's TTL serial interface ports 142–146 are used for down loading the firmware and for local terminal monitoring. A special down load cable is required to attach the TTL port to a serial port within computer 96 (preferably a personal computer serial port).

PLC24 reads the status of cassettes placed upon location 64–76 and the user-stop switch 98, and then provides the information to computer 96. The state table in PLC24 continuously monitors the cassette sensors and user-stop signals and places these values in the LAN registers. Computer 96 program reads the values and transmits the run/pause status of the ATRU back to the PLC24 over the ANET LAN. PLC24 uses the run/pause status to set the lights on the user-stop switches. PLC24 module 82 uses specific firmware which contains a user-definable logic table that simulates standard TTL logic circuit. The firmware also has a terminal monitor routine that, when used with a serial down load cable, can monitor the state table locally. The firmware communicates with the system computer 96 over an RS485 network. PLC24 programmed as a ANET slave node, the computer 96 acts as the ANET master node. PLC24 firmware places data into the ANET registers on the board. The ANET registers can be connected to the 24 I/O pins allowing data to be read or written over the ANET LAN interface.

Figure 15:
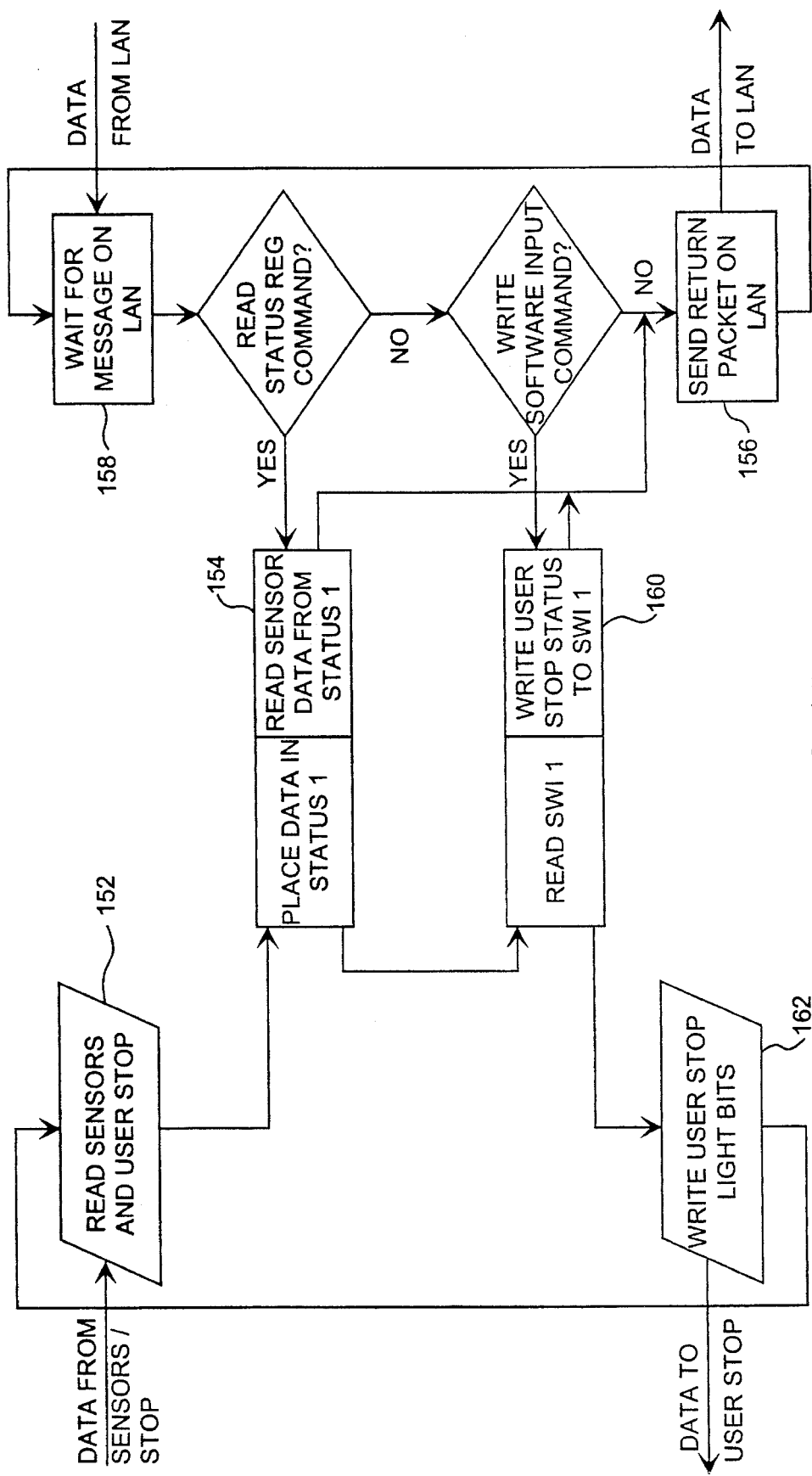
FIG. 15 is an operation flow diagram of the programmable logic controller according to the present invention.

Referring to FIG. 15, PLC24 signal flow and logic diagram is illustrated. Specifically, data from sensors 92 or from user-stop 98 can be read as indicated by block 152. The corresponding data can be placed in status 1 registers and thereafter read. Corresponding data can be sent or returned upon the LAN via blocks 154 and 156. The data can also be read as indicated by block 158. Data from computer 96 is read via the LAN, and corresponding software input commands can be written via block 160 to user-stop light bits 162 upon user-stop 98. Block 152 shows the routine used to read the input bits (i.e., data from sensors/stop) from the cassette present sensors and the user stop box. The result of the read is placed in a status register #1 block 154. When a LAM message is received (block 158), it is check to see if it is a read status register command. If so, the contents of block 154 are sent to the return LAM packet block 156 and thereafter sent to the LAN. When a LAN message is received (block 158), a write software input (SWI) command is issued. The message includes a byte of DATA that is written to SWI-1 (i.e., software input 1) at block 160.

Block 162 reads the data in SWI-1 and writes it to the output bits. Thereafter, the data is sent to the user stop.

PLC firmware continuously executes a state table that monitors signals on the TTL I/O bits and transmits the signals to computer 96 over ANET LAN. PLC24 uses two registers in ANET net 1 when communicating with computer 96: status and software input registers. PLC24 encodes all status signals on computer 96 into ANET status registers. PLC24 does not use all of the bits in the status register. The unused bits are set to 0. Computer 96 places the user-stop status in the software input register. The following Table IV is a list of PLC signals, their inputs and their outputs. The "PLC input" column shows the inputs that determine the state of each signal. The "PLC output" column shows where the PLC places the signal status.

TABLE IV

| | PLC24 INPUT | | PLC24 OUTPUT | |
|---|---|---|---|---|
| SIGNAL NAME | PLC24 BIT | ANET 1 SW BIT # | PLC24 BIT | ANET 1 STATUS BIT # |
| Cassette 1 | TTL 1 & TTL 5 | None | TTL 9 | 0 |
| Cassette 2 | TTL 2 & TTL 6 | None | TTL 10 | 1 |
| Cassette 3 | TTL 3 & TTL 7 | None | TTL 11 | 2 |
| Cassette 4 | TTL 4 & TTL 8 | None | TTL 12 | 3 |
| User-Stop | TTL 16 & TTL 20 | None | None | 7 |
| Run Light | TTL 16 & TTL 20 | None | TTL 13 & TTL 17 | None |
| Switch Light | TTL 16 & TTL 20 | 0 | TTL 14 & TTL 18 | None |
| Pause Light | TTL 16 & TTL 20 | 0 | TTL 15 & TTL 19 | None |

Figure 16:
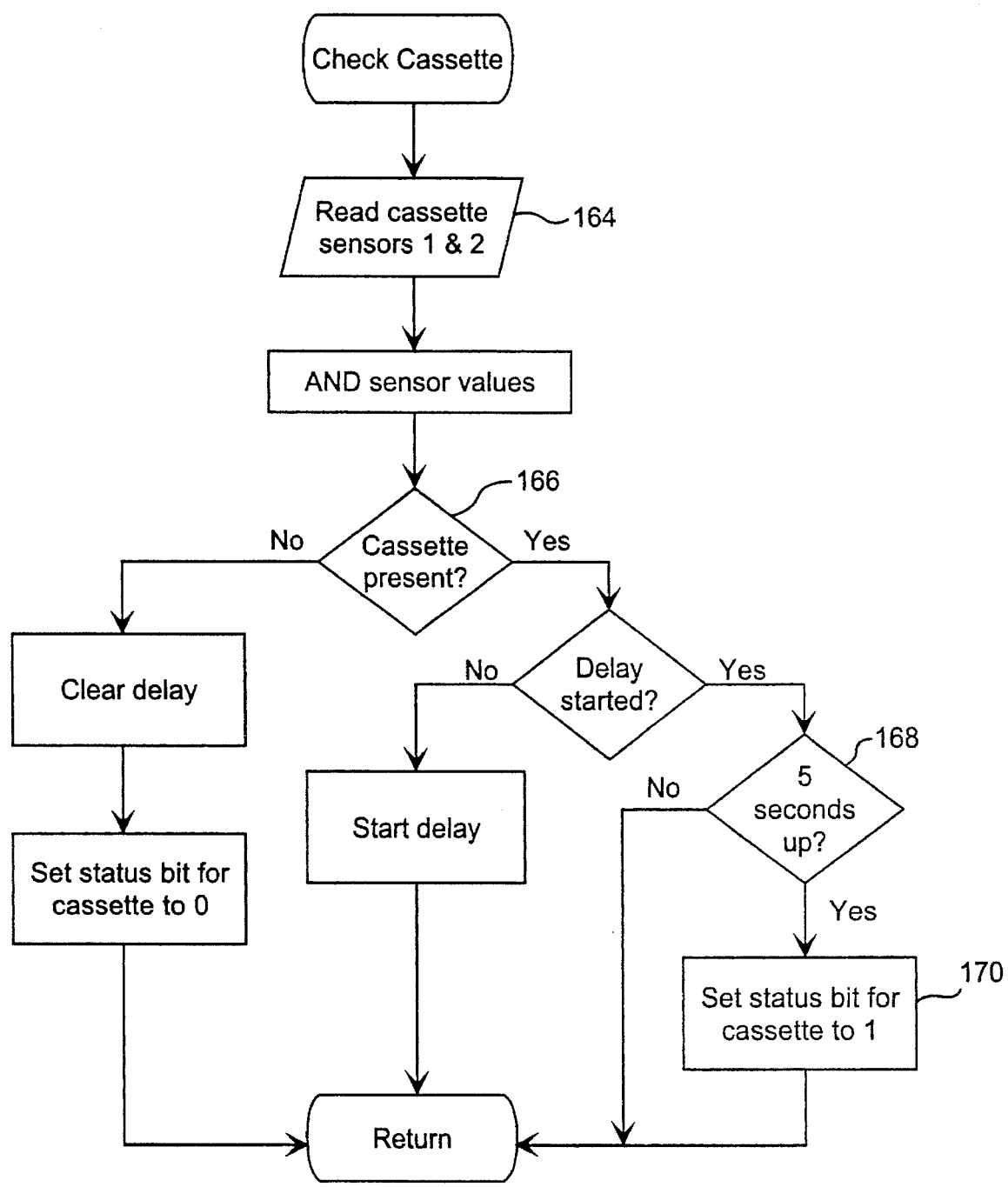
FIG. 16 is an operation flow diagram of the programmable logic controller interface to a plurality of sensors according to present invention.

PLC24 checks the status of cassette sensors 92 and user-stop switch 98 on each iteration of the state table. PLC24 checks the status of the cassette sensors in parallel and then checks the user-stop switches status. Each cassette typically has two sensors per cassette. Each cassette sensor can be on or off. When both sensors are off, a cassette is present. If one or both sensors are on, the cassette is missing. FIG. 16 illustrates a flow chart of the cassette sensor monitoring process according the present invention. An operator can place the cassette at various location upon robotic interface unit 50 and cassettes sensors 1 and 2 can be read according to block 164. The sensor values for both cassettes are anded to determine whether or not a cassette is present. The result of the anded value is either a 1 or 0 indicating if a cassette is in fact present as indicated by block 166. If a cassette is not present, delays are cleared and the status bit for the cassette is set to 0. The check status command is repeated until a cassette becomes present. If, however, a cassette is present during the first iteration or loop, a delay may be requested as indicated by block 168. The status bit for the cassette is then set for 1 indicating the presence of a cassette and the presence of a delay as indicated by block 170.

When a cassette is placed on a cassette stage or location, PLC24 state table delays the signal for five seconds as indicated in FIG. 16. The delay prevents transient signals from marking a cassette as present. If the signal remains constant for at least five seconds, PLC24 sets the status bit associated with the cassette stage to "off." PLC24 sets the status bits by writing to TTL 9 through TTL 12. When a cassette is removed from a cassette stage or location, PLC24 sets the associated status bit to "on" immediately. User-stop switch 98 can be on or off. When the user-stop switch is on, the user has toggled switch to the pause position. When the switch is off, the switch is toggled to the run position.

Figure 17:
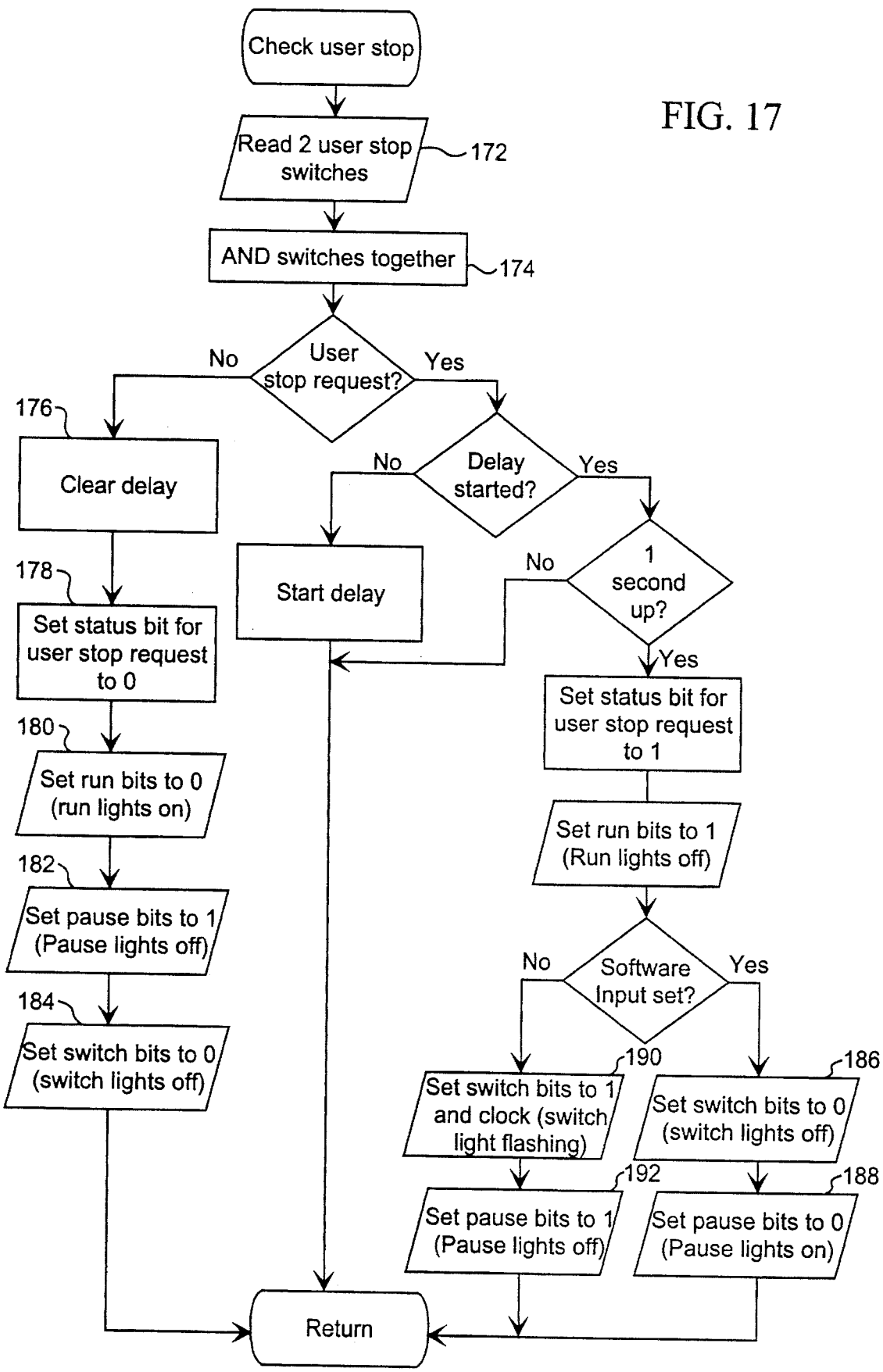
FIG. 17 is an operation flow diagram of a user stop interface to the programmable logic controller according to the present invention.

FIG. 17 is a flow chart that illustrates the process of monitoring the user-stop switch 98. It is important to note that many user-stop switches can be incorporated in the present invention. If either switch or the plurality of switches is in a pause position, PLC24 will generate a stop request. Accordingly, and as an example, two user-stop switches can be read as indicated by block 172. The on or off signal associated with each switch is then added together by block 174 to indicate whether a user-stop request has been issued or not. If a user-stop request has not been issued, then a clear delay will occur 176 and status bits for user-stop requests are set to 0 as shown in block 178. The run bits are also set to 0 causing run light to appear on, pause bits are set to 0 causing pause lights to appear off, and switch bits are set to 0 causing switch lights to appear off as indicated by blocks 180, 182, and 184. Conversely, if user-stop switch is on, then a delay is started up to one second and status bits for user-stop requests are set to 1, run bits are set to 1 and software input is either set or not set. If software is set (i.e., software input bit is set by computer 96), then switch bits are also set to 0 and pause bits are set to 0 causing switch light to turn off and pause light to turn on as indicated by blocks 186 and 188. Conversely, if software if not set, then switch bits are set to 1 and pause bits are set to 1 causing switch light to be flashing and pause light to appear off as indicated by blocks 190 and 192. PLC 24 delays the on signal for one second to prevent transient signals from changing the state. If the signal remains constant for at least one second, PLC24 sets the user-stop switch status bit to TTL 16. User-stop is not immediately granted. PLC24 turns off the run light and causes the pause request light to blink. When the controller program within computer 96 sends a signal that the user-stop request has been granted, PLC24 turns off the pause request light and turns on the pause light. When the user toggles the user-stop switch 98 to the run position, PLC24 immediately sets the user-stop switch status bit, turns off the pause light and turns on the run light.

Figure 18:
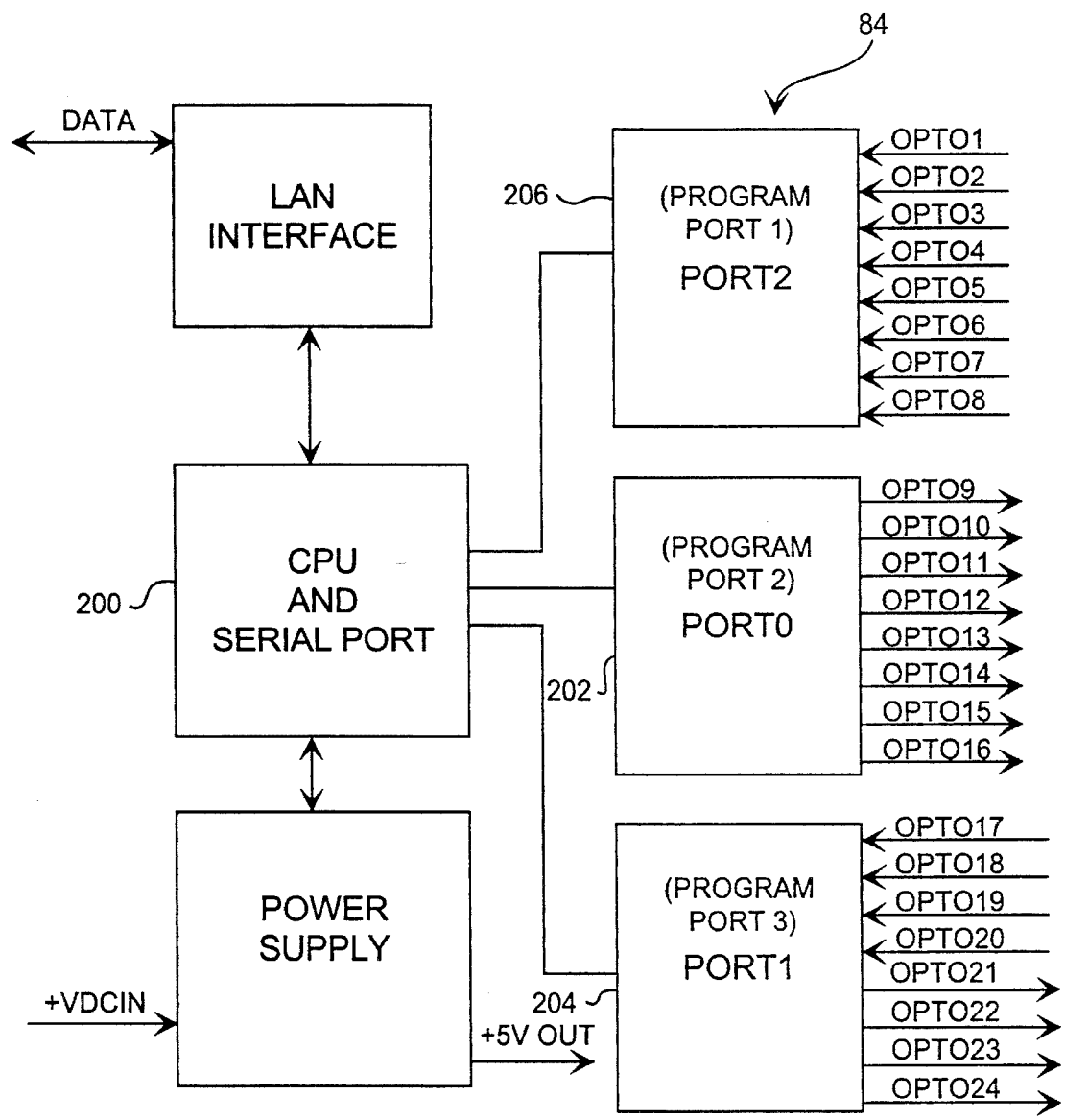
FIG. 18 is a block diagram of an opto-coupled logic controller according to present invention.

Referring now to FIG. 18, an opto-coupled logic controller 84, referred to as an OPTO 24 is illustrated. OPTO24 is a parallel digital control module with 24 optically isolated I/O bits that can be controlled remotely or by a built-in logic table. Interface unit 50 uses OPTO24 to intercept logic-level signals on interface cable 100. When OPTO24 intercepts a signal, it transmits the signal to host computer 96 via RS485 LAN 106. Computer 96 analyses and can change the signal. Computers 96 also can send the signal back to OPTO24, which passes the signal to its destination. OPTO24 module 84 consists of a microprocessor 200, a set of RS485 drivers, 24 OPTO isolators, and a TTL serial interface. Microprocessor 200, a suitable model being a DS5000 microprocessor having a model no. 8051 micro controller, is similar to the microprocessor systems described above. The micro controller includes a 32K of battery-backed static RAM, a one word watchdog timer, and a security system for application code. A state table in the microprocessor 200 controls OPTO24's reading and writing of interface data. The RS485 driver provides an ANET network interface. The drivers are connected to a built-in serial port on the microprocessor. The OPTO24 communicates with computer 96 over ANET LAN. OPTO24 has 24 opto-isolated I/O bits. The Opto isolators are connected to three 8-bit ports labeled 202, 204, and 206. Current flow to the opto isolator indicates a true status; the absence of current indicates a false status. Opto's TTL serial interface is used for down loading the board's firmware and for local terminal monitoring. A down load cable is required to attach the TTL port to the serial port of computer 96 (preferably a personal computer serial port).

OPTO24 boards are configured to have 12 inputs and 12 outputs comprising 24 I/O bits. The bits are shown in FIG. 18 as OPTO 1–24. The OPTO inputs and outputs are configured using custom register packs and DIP switches. Each I/O bit has a DIP switch associated with it. Each I/O bit can also have up to two current limiting resistors.

The following Table V shows the configuration of the OPTO24 board in the robotic interface unit 50 of the present invention. In the table, "on" indicates either a DIP switch is in the on position or a jumper is installed. RN1–10 are ohmic entries indicating a current limiting resistor.

TABLE V

| BIT | RN1 | RN2 | RN3 | RN4 | RN6 | RN7 | RN8 | RN9 | RN10 |
|---|---|---|---|---|---|---|---|---|---|
| 1 | 620 | 330 | ON | ON | ON | ON | ON | 620 | 620 |
| 2 | 620 | 330 | ON | ON | ON | ON | ON | 620 | 620 |
| 3 | 620 | 330 | ON | ON | ON | ON | ON | 620 | 620 |
| 4 | 620 | 330 | ON | ON | ON | ON | ON | 620 | 620 |
| 5 | 620 | 330 | ON | 330 | ON | ON | ON | 620 | 620 |
| 6 | 620 | 330 | ON | 330 | ON | ON | ON | 620 | 620 |
| 7 | 620 | ON | 330 | 330 | ON | ON | ON | 620 | 620 |
| 8 | 620 | ON | 330 | 330 | ON | ON | ON | 620 | 620 |

OPTO24 firmware monitors the interface cable between stepper 24 and coater/developer 10. OPTO24 can intercept twelve possible signals: six from stepper 22 to coater/developer 10 and six from coater/developer 10 to stepper 22. Twelve of the bits on OPTO24 read interface signals; another twelve transmit interface signals. OPTO24 module uses firmware contained within a user-definable logic table that simulates standard TTL logic signals. The firmware also has a terminal monitoring routine that, used with a serial down load cable, can locally monitor the state table parameters. The firmware communicates with computer 96 over RS485 network 106. OPTO24 is programmed as an ANET slave node; computer 96 acts as the ANET master. OPTO24 firmware uses a set of ANET registers on the OPTO24 to write and read data. The ANET registers can be connected to twenty four I/O pins on the OPTO24 to allow the I/O pins to be accessed over the ANET LAN interface.

State table in the OPTO24 continuously monitors the signals on twelve interface line pairs (24 wires) between stepper 22 and coater/developer 10 and places the signals values in the ANET LAN registers. OPTO24 does not monitor the other six line pairs (12 wires). The interface unit controller program reads the signal values and modifies them as needed. The controller program then transmits the signals back to OPTO24 module over ANET LAN. OPTO24 module writes the new signals out to the interface lines.

Figure 19:
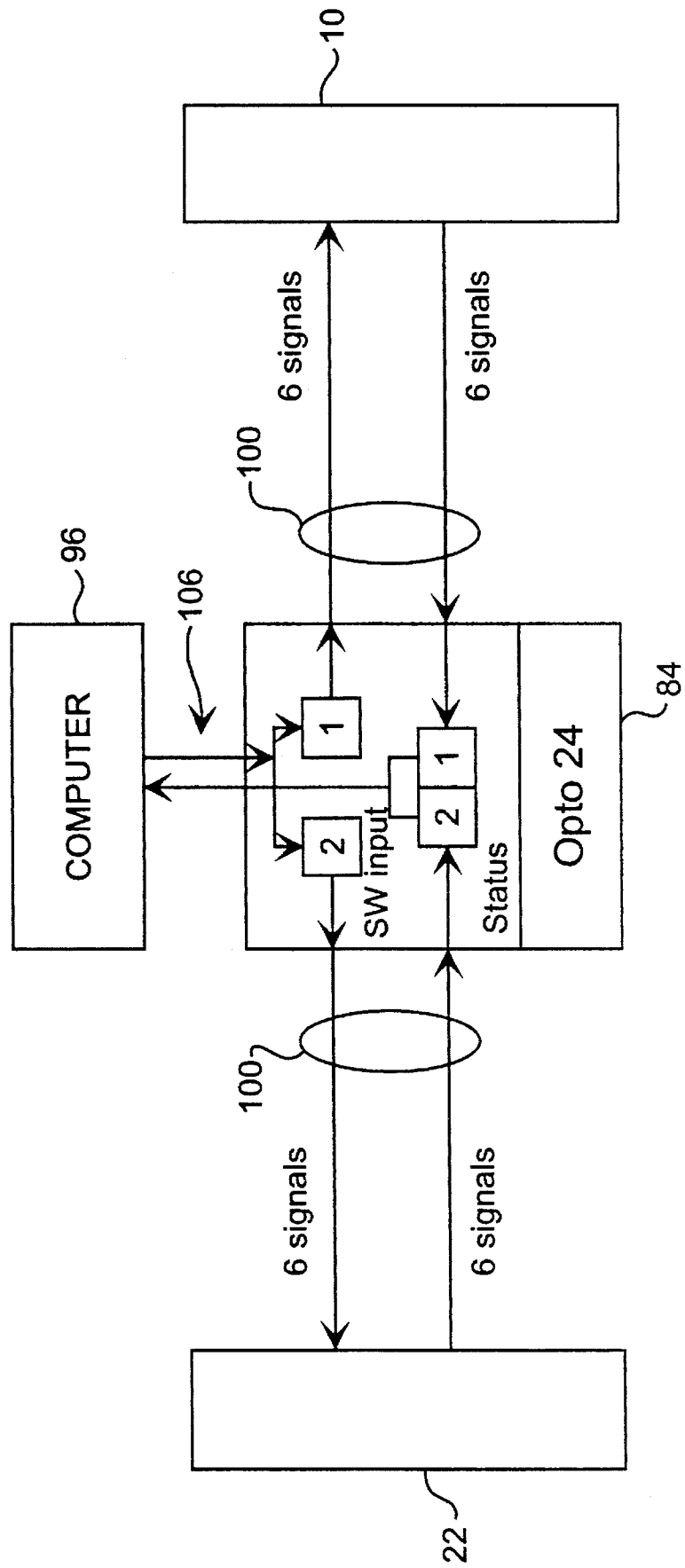
FIG. 19 is an operation flow diagram of the opto-coupled logic controller according to the present invention.

FIG. 19 illustrates data flow through OPTO24 module 84. SW Input, shown in module 84 indicates software input and specifically is a register used by ANET to write information to the module (e.g., stepper or coater/developer control bits written to module 84). Status 1 and 2 indicated in module 84 are registers used by ANET to read information from the module (e.g., stepper or coater/developer control bits read from module 84). The following Table VI contains a list of twelve intercepted interface signals sent from stepper 22 to coater/developer 10 of which OPTO24 intercepts according to the retrofit characteristics of the present invention.

TABLE VI

| SIGNAL | NAME | DESCRIPTION |
|---|---|---|
| CON | Coater portion of on-line coater/developer | Coater portion of coater/developer asserts this signal as long as it is ready to process wafers |
| DON | Developer portion of on-line coater/developer | Developer portion of coater/developer asserts this signal as long as it is ready to process wafers |
| TEL | Track-end lot | Coater/developer asserts this signal to indicate the end of the current lot |
| TRR | Track ready to receive | Coater/developer asserts this signal when it is ready to receive a wafer |
| TS | Track send | Coater/developer asserts this signal when it sends a wafer after receiving ARR and AON |
| AON | Aligner on-line | Stepper asserts this signal as long as it is ready to process wafers |
| ARJ | Aligner reject | Stepper asserts this signal to indicate that the wafer was rejected by the aligner |
| AEL | Aligner end lot | Stepper asserts this signal to indicate the end of the current lot |
| ARS | Aligner ready to send | Stepper asserts this signal when it has a wafer to send to the coater/developer |
| AS | Aligner send | Stepper asserts this signal when it sends a wafer to coater/developer |
| ARR | Aligner ready to receive | Stepper asserts this signal when it is ready to receive wafers from coater/developer |

On each pass of the state table, OPTO24 takes the inputs from coater/developer 10 and places them in the status register of ANET net 1. OPTO24 does not use all of the bits in the status register; unused bits are set to 0. Robot controller program store within computer 96 reads the values of the status register and modifies them as needed, and then places the values in the software input registers of ANET net 2. OPTO24 reads the value of the software input register and places the values on the stepper's input lines. When OPTO24 has processed the coater/developer's signals, OPTO24 takes the inputs from the stepper's output lines and places them in the status register of ANET net 2. OPTO24 does not use all of the bits in the status register; unused bits are set to 0. Interface unit controller 96 reads the signals, modifies them as needed, and places the new values in the software input register of ANET net 1. OPTO 24 reads the values in the software input register and places the values on the coater/developer's input lines.

Figure 20:
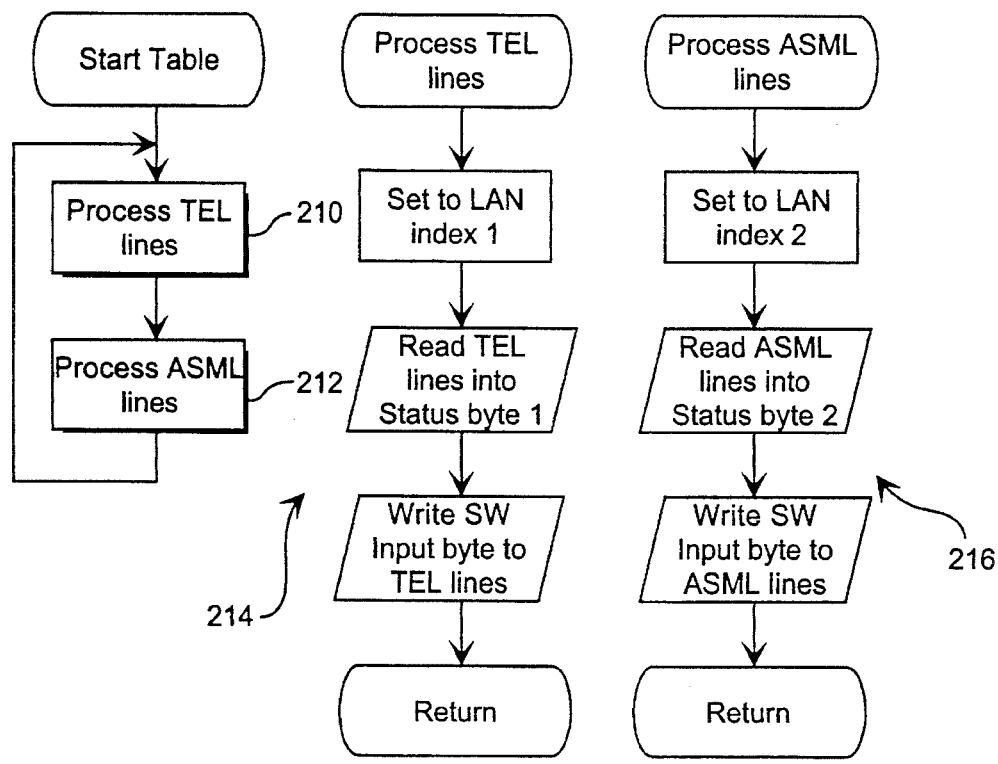
FIG. 20 are flow diagrams of the opto-coupled logic controller state table operation according to the present invention.

Referring to FIG. 20, a logic flow diagram of OPTO24 state table is illustrated. In particular, input from coater/developer 10 designated as "TEL" lines is processed prior to input from stepper 22, designated as "ASML" lines, as indicated by process blocks 210 and 212. The processing of TEL and ASML lines are repeated in a loop for continuous processing. The TEL lines are processed by setting LAN index 1 and reading TEL lines into status bit 1. Subsequently, SW input bits are written to the TEL lines as illustrated by process blocks 214. Similarly, ASML lines are processed by setting LAN index to 2, reading ASML lines into status bit 2 and then writing SW input bits to ASML lines as indicated by process flow 216. As defined herein, ANET net 1 is a set of registers configured within a given module (i.e., DLC24, PLC24 or OPT24 modules). Status registers are a subset of the registers within each module in a given net and within the DS5000.

The software communication over ANET LAN and various protocols used for interfacing computer 96 and modules 80, 82, and 84 configured within the LAN network are achieved using an RS485 protocol called ANET, defined hereinabove. The ANET is a master-slave LAN with one master and one or more slave modules. A master node module located on the DTIF card 112 located within computer 96 controls all communication over ANET. There are four nodes on the ANET network: (i) an ANET master node connected to computer 96; (ii) a DLC24 module connected to the CYBEQ port on stepper 22; (iii) a PLC24 module connected to the cassette sensors 92 and user-stop switch 98; (iv) an opto module connected to the stepper-coater/developer interface cable 100. Each node on the ANET network has a unique node number. The following Table VII lists the node numbers of the nodes in the interface unit 50.

TABLE VII

| MODULE | NODE # | PURPOSE |
|---|---|---|
| Master | 255 | Controls network communication |
| DLC24 | 1 | Receives stepper commands |
| PLC24 | 2 | Provides cassette and user-stop information |
| OPTO24 | 3 | Intercepts stepper-coater/developer interface line signals |

An ANET network transaction consists of sending a message to a node and receiving a response. The node's response must occur within a specified amount of time. If a timeout occurs, or if there is an error, the sending node will re-transmit the message up to five times. Robot controller program logs an entry in the log file whenever a node has a retry transmission. After a specified failed attempts, the sending node will report a communication error. All of the communication over the ANET is done to and from the master node. When the master node receives a message data packet from computer 96, it checks the node number on the message. If the message if for the master node, it processes the message; otherwise, the master node transmits the message to the proper node.

Computer 96 communicates with the master node module through three I/O ports on the I/O expansion bus contained within computer 96. The following Table VIII lists the master nodes I/O ports and their purpose.

TABLE VIII

| PORT NAME | ADDRESS | TYPE | PURPOSE |
|---|---|---|---|
| Data | x370h | I/O | Send/receive data bytes |
| Command | x770h | I/O | Terminate transmissions |
| Status | xB70h | Output | Master node status byte |

Messages sent over the LAN are encoded into a data packet for transmission. Any form of encoding can be used providing it include a node address, command/reply, packet length, data bytes and check sum. The robot controller program continuously polls the status port for a non-empty receive buffer. If the buffer is not empty, the controller program reads data bytes from a data port until the status port is set indicating that the entire message has been received or that a timeout has occurred.

The ANET master node controls all network communication. The master node send commands to the network's slave modules, which respond to the commands. The master node module is a daughter board 110 on DTIF board 112, which is plugged into computer 96 expansion bus. The master node is plugged into one of three IDC connectors on the DTIF board. IDC connectors represents a type of PCB configuration common in the industry. Computer 96 communicates to the master node module through the expansion bus. At start up, computer 96 initializes the ANET master node and sets the network parameters. The robot controller program does not send messages intended for the master node after initialization unless there is a network error. Computer 96 also sends data to the master node in the special packet. Controller program checks the status port to verify that there is space in the transmit buffer before it writes each byte to the data port. Computer 96 writes a 0 to the command port when it has transmitted the entire message. The packet used by computer 96 to send data to the master node is similar to the ANET LAN packet, except that the master node packet does not include a check sum.

The DLC24 node communicates with stepper 22 through mini bus cable 94. Computer 96 can send three messages to DLC24: (i) reset command (10$h$), (ii) get status queues command (34$h$), and send status command (43$h$). Computer 96 sends a reset command to DLC24 when interface unit 50 is initialized or when computer 96 loses communication with the DLC24. The reset command causes DLC24 to reload its firmware. The get status queues command reads all the stepper 24 commands currently in the DLC24 queues. DLC24 returns a 4-byte packet for each command in the queue. The first byte may indicate cassette number, the second byte may indicate stepper 22 command and the third and fourth bytes may be unused. The send status command writes one of the two CYBEQ status bytes associated with a given cassette to the DLC24. DLC24 then places the status byte in a LAN register specified by computer 96. Computer 96 then sends two data bytes to the DLC24 as part of the send status command. The first data byte is the target LAN register number. The robot controller program uses the following formula to determine the LAN register number: (cassette #−1) * 2+status #. The second data byte sent by computer 96 is the new value of the status register.

PLC24 node monitors the status of the cassette sensors 92 and the user-stop switch 98. Computer 96 can send three messages to PLC24: (i) reset command (10$h$), (ii) get cassette present commands (30$h$), and (iii) send load light command (43$h$).

Computer 96 sends a reset commands to PLC24 when interface unit 50 is initialized or when computer 96 loses communication with PLC24. The reset command causes the PLC to reload its firmware. The get cassette present command causes the PLC to return cassette and user-stop status information. Computer 96 sends two data bytes with this command. Computer 96 sets the first data byte to 1 before sending the command to indicate that the sensor data is in LAN register 1. PLC24 fills the second data byte with cassette and user-stop status information. PLC24 encodes the status information into the second data byte having eight bits. The 1st bit is used to determine cassette one status, the 2nd bit is used to determine cassette two status, the 3rd bit is used to determine cassette three status and the 4th bit is to determine cassette four status. Bits 5–7 may be unused and the 8th bit may be used to determine user-stop switch status. The send load light command changes the state of the load light. Computer 96 sends 2 data bytes with the send load light command. Computer 96 sets the 1st data byte to 1 to indicate that PLC24 should use LAN register one. The 2nd byte is either on or off.

OPTO24 node reads and writes information to interface cable 100. OPTO24 node is configured as node 3 on the network. Computer 96 can send three messages to OPTO24: (i) the reset command (10$h$), (ii) the get INT lines command (30$h$), and (iii) the set INT lines command (43$h$). Computer 96 sends a reset command to OPTO24 when interface unit 50 is initialized or when computer 96 loses communication with OPTO24. The reset command causes OPTO24 to reload its firmware. Get INT lines command instructs OPTO24 to read the status of the interface lines running from stepper 24 and coater/developer 10. Computer 96 sends 4 data bytes with this command. The 1st byte indicating number of the LAN register containing the data output by the coater/developer. The 2nd byte is used by OPTO24 to place the status of 6 coater/developer output lines in bits 0 through 5 of this byte. The 3rd byte indicates the number of LAN registers containing the data output by stepper 22, and the 4th byte is used by OPTO24 to place the status of the six stepper output lines in bits 0 through 5 of this byte.

The set INT lines command allows computer 96 to change the status of signals sent across interface cable 100. Computer 96 sends four data bytes with this command. The 1st byte indicates the number of the LAN register containing the data to pass to coater/developer 10. The 2nd byte includes bits 0 through 5 containing the new values for the six input lines to the coater/developer. The 3rd byte indicates the number of the LAN register containing the data to pass to stepper 24, and the 4th byte includes bits 0 through 5 which contain the new value for the 6 input lines to stepper 22.

Interface unit 50 communicates with robot 104 using RS232 serial communication. Robot controller program uses CommLib from Greenleaf Software, Inc. of Dallas, Tex. to perform its serial communication task. CommLib provides full-duplex, interrupt ribbon serial communication, which allows communication to occur without intervention by the robot controller program. All robot commands and return values are ASCII text strings. The robot controller program can send two types of commands to the robot: (i) commands that are set or request status information, (ii) robot controller 102 usually waits for a response from 104 during status commands. Movement commands require a large amount of time to complete, so the controller program does not wait for the robot to finish. The controller program continues executing, periodically polling the robot to see if it has finished moving. Before the robot controller program sends the command to the robot, it first checks the communication link by sending a carriage return. If robot 104 responds with a status prompt, then the link is open and the controller program sends the command. The controller program does not test the link while the robot is scanning a cassette, since the robot will not respond while it is counting wafers. The controller program expects a return value for most robot commands. Although the return value ends on the command sent, most commands return a 4-byte robot status word. The controller program checks the value returned by the robot to verify that the robot executed the commands correctly.

The robot controller program is listed in the microfiche index incorporated herein. The main function of the robot controller program is to service the various parts of interface unit 50, stepper 22 and coater/developer 10. Contained within the robot controller program is a main loop which services the following processes: cassette status monitor, user-stop system, cassette scanner, stepper command queue service, interface line service routine, stepper command processor, user commands processor, and screen update mechanism. The controller program performs round-robin polling of each process to determine when the process needs servicing. Any service that has idle time returns to the main loop until the service is complete.

The cassette status monitor functions by monitoring each of the four wafer cassette locations 66, 68, 70 and 72. Each platform having a status sensor that indicates if there is a cassette sitting on the platform location. Interface unit must monitor sensors 92 to detect the removal or addition of a cassette. The robot controller program gets the cassette status information by sending a status request to PLC24 module over the ANET LAN. If the PLC24 reports the addition of a cassette, the robot controller program will mark the cassette to be scanned by the cassette scanner process. If PLC24 reports the removal of a cassette, and the user-stop switch is not in the pause position, the controller program will generate an error. PLC24 also reports the status of user-stop switch when it returns the cassette status information. If PLC24 reports the user-stop switch 98 is in the pause position, the controller program sets a pause request flag; otherwise, the controller will clear the request flag.

The user-stop system provides a method for the user to pause the robot. When the user toggles the user-stop switch 98 to the pause position, the controller program does not automatically grant the request. The controller program must be sure that robot 104 can be paused without causing a timeout error on stepper 22. Thus, the user-stop 98 can be in one of three states: a run mode, stop request mode or pause mode. The controller program uses a pause request flag to determine the state of the user-stop switch 98. The cassette status system sets the pause request flag based on the value returned by PLC24. If the controller program sets the user-stop flag while interface unit 50 is in run mode, user-stop 98 changes the stop request mode. When the user-stop system is in a stop request mode, the controller program commands the robot to move to the neutral station. If the robot is scanning a cassette, the program commands the robot to abort the scan. The robot busy flag remains set until the robot stops at the neutral station. The program must wait until the robot busy flag is cleared before it can grant a user stop. Once the robot busy flag is cleared, the program sets status flags that tell stepper 22 that the send cassettes are empty and the receive cassettes are full. This causes stepper 22 to wait without causing a time-out period. The controller program also starts a delay timer to allow for the possibility that stepper 22 has already sent a command that interface unit 50 has not received. If the robot busy flat remains clear and stepper 22 does not send any commands before the delay expires, the controller program grants the user-stop request. The controller commands the PLC24 to set the pause light. If a stepper command arrives before the delay time expires, the controller program processes the command and restarts the delay counter. The controller program checks the pause request flag each time that the program services the user-stop system. The program takes no action if the flag is still set. If a flag is clear, the program re-enables the robot and commands PLC24 to clear the pause light. If the robot was in the process of scanning a cassette when the system was paused, the controller program commands the robot to re-start the scan.

Before interface unit 50 can use a cassette, the robot must scan it for wafers. The scan provides a map of which slots in the cassette have wafers. Interface unit 50 uses the wafer map to determine where to get and to put wafers. Before scanning, the scanner checks to see if a scan is already in progress. If there is a scan in progress and robot 104 has completed the scan, interface unit 50 will read the status of the scan.

For the cassette scanner to scan a cassette, the cassette must be marked as needing to be scanned, the stepper command queue must be empty and the user-stop 98 switch must be in the run position. The controller will not scan the cassette if any of the above conditions are not met. The controller program will resume polling the other processes until the condition changes. To scan a cassette, the controller program causes stepper 22 to think that the send cassettes are empty and the receive cassettes are full. Stepper 22 will wait without a time-out until the controller program sends a message that the cassettes have been changed. The program then commands robot 104 to perform a scan.

Interface unit 50 receives a command from stepper 22 by continuously polling DLC24 module. The controller program maintains a queue of stepper 22 commands that are awaiting processing. The controller program process stepper 22 commands in the order they are received, except the exit feed through command for cassette two. Stepper 22 sends so many exit feed through commands for cassette two that the robot controller must process them immediately to avoid a queue overflow. The robot controller program maintains a count of the number of stepper 22 send/receive wafer commands in the command queue. The program increments the counter when it receives a send/receive wafer command from stepper 22 and decrements the counter when it pulls a send/receive wafer from the queue.

Robot controller program spends the majority of its time processing commands from stepper 22. The controller program reads commands from stepper 22 command queue and converts them into the required robot commands. Each time the robot controller program enters the stepper 22 command processor, the processor performs two tasks. First, if a command is in progress, the processor continues processing the commands. The only command that requires continuation is the send/receive wafer command. The second task that the command processor performs is to handle any new commands. Stepper 22 can send twelve commands to interface unit 50. The effect of each command is described below.

(1) Set pitch/diameter—causes the controller program to set the overridden flag in status word 1 of the indicated cassette.

(2) Set wafer count—causes the controller program to set the wafer count bit in status word 2 of the indicated cassette to a new value.

(3) Send/receive wafer—the action of the send/receive wafer command depends on the current value of the feed through and receive mode flags on the cassettes and whether a send/receive command has been received for the companion feed or discharge cassette.

(4) Send status one—causes the robot controller 102 to send status word 1 of the indicated cassette to stepper 22.

(5) Send status two—causes the controller program to send status word 2 of the indicated cassette to stepper 22.

(6) Set to reference—causes the controller program and the reference flag in status word 2 of the indicated cassette to be true.

(7) Set to sender—causes the controller program and the receive mode flag in the status word 2 of the indicated cassette to be false.

(8) Set to receiver—causes the controller program to set the receive flag in status word 2 of the indicated cassette to true.

(9) Immediate stop—causes the controller program to set the ready flag in status word 1 of the indicated cassette to true.

(10) Go to feed through—causes the controller program to set the feed through and ready flags to true and to clear the wafer not detected error in the status word on the indicated cassette.

(11) Exit feed through—causes the controller program to set feed through flag to false, ready flag to true and clear the wafer not detected error in the status word of the indicated cassette.

(12) Reset cassette—causes the controller program to set the reference and wafer flags to false in the status words of the indicated cassette.

Stepper commands are those suitably used in an ASM Lithography Corporation of Veldhoven, The Netherlands, model no. PAS 2500 stepper. However, it is understood that other steppers may be used and interfaced by the robotic interface unit 50 with slight modifications to the hardware and robotic controller software program described herein.

The robotic controller program processes a send/receive wafer command based on the current value of the feed through and receive mode flags in the status word of the affected cassette, and whether stepper 22 has sent a send/receive wafer command to the companion cassette. The controller program cannot immediately execute the command if one of the following conditions are true: (i) the user-stop is in the pause position, (ii) the robot is busy, (iii) another transfer is in progress, (iv) the cassette is not in feed through mode and it is missing, and (v) the cassette is not ready. If the controller program can execute the command, the program clears the ready and wafer flags and the wafer not detected error in the cassette's status word. Stepper 22 can request four different actions in the send/receive wafer command. First, stepper 22 can get a wafer from the back feed cassette 62. Second, stepper 22 can get a wafer from the front feed cassette. Third, stepper 22 can put a wafer to the back discharge cassette 72. Fourth, stepper 22 can put a wafer in the front discharge cassette 70. If stepper 22 requests a get from the front feed cassette 66, the controller program checks to see if the front feed cassette 66 is in feed through mode. If the cassette is not in feed through mode, the program commands the robot to get the lowest wafer in the front feed cassette 68. If the front feed cassette 68 is in feed through mode, the controller verifies that stepper 22 has already sent a send/receive command requesting a get from the back feed cassette 66. If stepper 22 has issued a get for the back feed cassette 66, the controller checks the feed through flag on the back feed cassette 66. If the back feed cassette 66 is not in feed through mode, the program commands the robot to get the lowest wafer in the back feed cassette 66. If the back feed cassette is in feed through mode, the program will command the robot to get a wafer from coater/developer 10.

If stepper 22 requests a get from back feed cassette 66, the controller verifies that stepper 22 has already sent a send/receive command requesting a get from the front feed cassette 68. If is has, the controller program checks the feed through flag on the back feed cassette 66. If the back feed cassette 66 is not in feed through mode, the program commands the robot to get the lowest wafer in the back feed cassette 66. If the back feed cassette is in a feed through mode/ the program will command the robot to get a wafer from the coater/developer 10.

If stepper 22 requests a put to the front discharge cassette, the controller program checks to see if the cassette is in the feed through mode. If the cassette is not in feed through mode, the program commands the robot to put the wafer in the first slot below the last wafer. If the cassette is in feed through mode, the controller verifies that stepper 22 has already sent a send/receive command requesting a put to the back discharge cassette 72. If stepper 22 has issued a put to the back discharge cassette 72, the controller checks the feed through flag on the back discharge cassette 72. If the cassette is not in feed through mode, the program commands the robot to put the wafer in the first slot below the last wafer. If the back discharge set is in a feed through, the program will command the robot to put the wafer on the coater/ developer 10.

If stepper 22 requests a put to the back discharge cassette, the controller verifies that stepper 22 has already sent a send/receive command requesting a put to the front discharge cassette 70. If it has, the controller program checks the feed through flag on the back discharge cassette 72. If the cassette is not in feed through mode, the program commands the robot to put the wafer in the first slot below the last wafer. If the back discharge cassette 72 is in feed through mode, the program will command the robot to put the wafer on the coater/developer 10.

Once the controller program has determined the source or destination of the wafer, the controller program begins the wafer transfer. If the robot is moving the wafer from coater/developer 10 to stepper 22, then the controller program will wait for the coater/developer to assert the TS (track send) imprint signal on interface cable 100. The controller program commands the robot to pick up the wafer from the coater/developer transfer station 64. The controller program sets the wafer and ready flags for the back feed cassette and sends them to DLC24 module. The controller program must set the status flags before the wafer transfer is complete to avoid a time out on stepper 22. The controller program commands the robot to place the wafer on stepper 22 chuck 36. When the robot is ready to place the wafer on chuck 36, the controller program sets the wafer and ready flags for the front feed cassette 68 and sends them to DLC24 module. The flags cause the air to chuck 36 to be turned on as the wafer is placed on chuck 36.

Robot 102 can also move wafers from back feed cassettes 66 to stepper 22 following procedures similar to those described above. Furthermore, robot can move wafers from front feed cassettes 68 to stepper 22. Conversely, robot 104 can move wafers from stepper 22 to the front discharge cassette 70 and/or the back discharge cassette 72.

Interface unit 50 monitors, and in some cases modifies, signals sent over interface cable 100. When robot 104 is busy during a send/receive command, the controller program keeps the coater/developer from inserting TS signals by setting the ARR signal to low. The TS signal must be high before the controller program can set the ARR signal to low. The controller program also modifies signals on interface cable 100 to keep stepper 22 from generating timeout errors. The robot controller reads signals on cable 100 by sending a request to OPTO24 module. The controller program changes the values on the interface lines by writing new values to OPTO24 module.

Robot controller program continuously scans keyboard 97 of interface unit 50 for key strokes. If the user presses a key, the program verifies that the key is a valid command. If the key is not a valid command, the program displays an error message on monitor 99.

Figure 21:
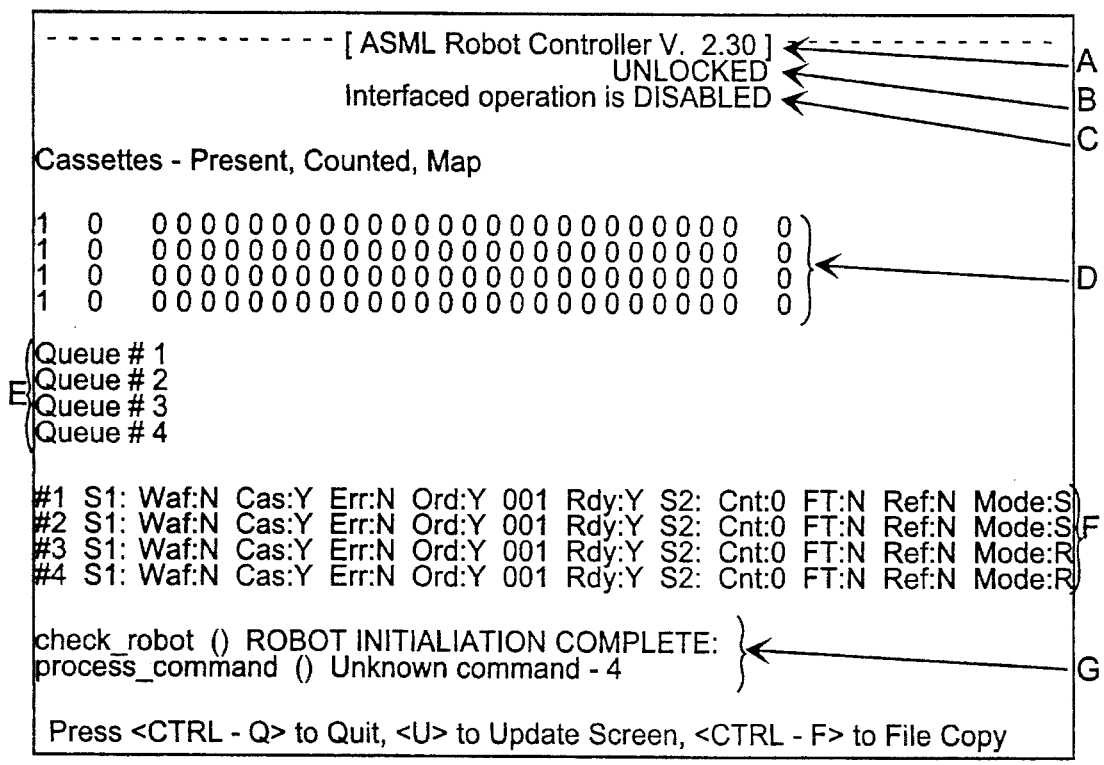
FIG. 21 is an exemplary display of wafer status shown upon a computer monitor according to the present invention.

Monitor 99 displays the status of interface unit 50 and allows the operator to view the current status of the controller program. FIG. 21 illustrates an exemplary display. Line A displays the program name and version number of the robot controller program loaded within computer 96. Line B indicates whether or not user-stop 98 switch can be used to pause the system at the current time. Locked status indicates that interface unit 50 cannot be paused when robot 104 is moving. Line C indicates the current operation mode for interface unit 50 (whether or not unit 50 is in a stand-alone or interface mode). Line D illustrates the status of each of the four cassettes 66, 68, 70 and 72. The first number on each line will be a "1" if a cassette is present. The second number on each line will be a "1" if interface unit 50 has counted the wafers in the cassette. The remaining numbers on each line are a map of the wafers in the cassette. A "1" on the map indicates that there is a wafer in the corresponding slot in the cassette. The last number on each line is the total number of wafers in the cassette. Lines E display the contents of the four stepper 22 command queues. The command queues are usually blank unless a problem occurs causing interface unit 50 to be unable to service stepper 22 commands. Lines F illustrate the status information of each of the four indexers. This information is used for fault isolation. Lines G illustrate error and status messages generated by the robot controller program.

As stated above, robot controller program and all programs necessary to interface with the hardware described herein are listed in microfiche appendix and incorporated by reference. It is understood, however, that the program listed herein describes an exemplary specific embodiment for interface with particular steppers and coater/developers. However, various steppers and coater/developers fall within the spirit and scope of the present invention as will be appreciated to those skilled in the art having the benefit of this disclosure. Furthermore, it is also to be understood that the form of the invention shown and described is to be taken as a presently preferred exemplary embodiment. Various modifications and changes may be made without departing from the spirit and scope of the invention as set forth in the claims. An exemplary modification might be varying types of steppers and coater/developers and corresponding changes in interface therebetween. Moreover, various changes to hardware which achieve the same function as that stated herein may be made without departing from the present invention. It is intended that the following claims be interpreted to embrace all such modifications and changes.

What is claimed is:

1. A robotic interface unit, comprising:
    a wafer stepper unit adapted for exposing a photoresist covered wafer to a light source configured within said wafer stepper unit;
    at least one wafer storage location configured on said robotic interface unit located adjacent to a wafer stepper unit;
    a robotic arm configured on said robotic interface unit and moveable in three dimensions, said robotic arm includes an upper extendable surface adapted for lifting a wafer at a point on the backside surface of the wafer and moving said wafer between said wafer storage location and said wafer stepper unit, said robotic arm further includes:
    a plurality of optical sensors placed in close proximity to said wafer storage location;
    an interface network coupled to said wafer stepper unit, said coater/developer unit and said optical sensors;
    a computer coupled to said interface network; and
    a robot controller coupled between said computer and said robotic arm for controlling the movement of said robotic arm in response to a program input stored within said computer.

2. The robotic interface unit as recited in claim 1, wherein said computer comprises a memory medium and a keyboard, said keyboard is adapted for allowing access of said input program upon said interface network.

3. The robotic interface unit as recited in claim 1, wherein said computer comprises a memory medium for storing the status of said sensors, said computer further comprises a display adapted for visually displaying the status of said sensors.

4. The robotic interface unit as recited in claim 1, wherein said interface network comprises:
 a digital logic controller coupled between said wafer stepper unit and said computer;
 a programmable logic controller coupled to said sensors; and
 an opto-coupled logic controller coupled between said digital logic controller and said programmable logic controller, said opto-coupled logic controller further coupled between said wafer stepper unit and said coater/developer unit.

5. The robotic interface unit as recited in claim 4, wherein said digital logic controller, said programmable logic controller and said opto-coupled logic controller each having a programmable processor for receiving said program input stored within said computer.

6. A robotic interface system for transferring wafers between a wafer coater/developer unit and a wafer stepper unit, comprising:
 a wafer coater/developer unit adapted for coating a wafer with photoresist and presenting said coated wafer at a pickup location within said coater/developer unit;
 a wafer stepper unit adapted for selectively exposing said coated wafer and presenting said exposed wafer at a dipod location within said wafer stepper unit;
 a robotic interface unit placed adjacent to said wafer stepper unit, said robotic interface unit comprises:
  a platform upon which at least one discharge cassette and at least one feed cassette are located;
  first means for moving said coated wafer from said pickup location to said feed cassette;
  a robotic arm moveable in three dimensions and having an upper extendable surface adapted for lifting said coated wafer at a point on the backside surface of the wafer and moving said coated wafer from said feed cassettes to said wafer stepper unit and for moving said exposed wafer from said dipod location to said discharge cassettes; and
  second means for moving said exposed wafer from said discharge cassettes to a dropoff location within said wafer coater/developer unit.

7. The robotic interface system as recited in claim 6, wherein said first means comprises means for inserting said coated wafer into said feed cassette from said pickup location remote from said robotic interface unit.

8. The robotic interface system as recited in claim 6, wherein said second means comprises means for transporting said discharge cassette containing said exposed wafer to said dropoff location remote from said robotic interface unit.

9. The robotic interface system as recited in claim 6, wherein said robotic arm comprises:
 a plurality of optical sensors placed in close proximity to said feed cassette and said discharge cassette;
 an interface network coupled to said wafer stepper unit, said coater/developer unit and said optical sensors;
 a computer coupled to said interface network; and
 a robot controller coupled between said computer and said robotic arm for controlling the movement of said robotic arm in response to a program input stored within said computer.

10. The robotic-interface system as recited in claim 6, wherein said computer comprises a memory medium and a keyboard, said keyboard is adapted for allowing access upon said interface network said program input stored within said medium.

11. The robotic interface system as recited in claim 6, wherein said computer comprises a memory medium for storing the status of said sensors, said computer further comprises a display adapted for visually displaying the status of said sensors.

12. The robotic interface unit as recited in claim 6, wherein said interface network comprises:
 a digital logic controller coupled between said wafer stepper unit and said computer;
 a programmable logic controller coupled to said sensors; and
 an opto-coupled logic controller coupled between said digital logic controller and said programmable logic controller, said opto-coupled logic controller further coupled between said wafer stepper unit and said coater/developer unit.

13. The robotic interface unit as recited in claim 12, wherein said digital logic controller, said programmable logic controller and said opto-coupled logic controller each having a programmable processor for receiving said program input stored within said computer.

14. A method for moving wafers into a wafer stepper unit comprising the steps of:
 placing a robotic interface unit having an arm adapted for three dimensional movement adjacent to a wafer stepper unit;
 activating a computer having a stored program movement of said arm;
 moving said arm in response to said program movement between said wafer stepper unit and a wafer storage location configured upon said robotic interface unit;
 placing a wafer upon an upper surface of said arm;
 moving said wafer between said wafer storage location and said wafer stepper in response to movement of said arm;
 generating location signals corresponding to a location of said wafer within said wafer stepper and said wafer storage location;
 storing said location signals within said computer;
 displaying said location signals upon a monitor associated with said computer;
 activating a keyboard associated with said computer to cause a change in said location signal; storing the change in said location signals within said computer; and
 displaying the change in said location signals upon a monitor associated with said computer.

15. A method for moving wafers into a wafer stepper unit comprising the steps of:
 placing a robotic interface unit having an arm adapted for three dimensional movement adjacent to a wafer stepper unit;
 activating a computer having a stored program movement of said arm;
 moving said arm in response to said program movement between said wafer stepper unit and a wafer storage location configured upon said robotic interface unit;
 attaching said robotic interface unit between a wafer coater/developer unit and said wafer stepper unit; and
 moving said arm between said wafer stepper unit and said wafer coater/developer unit.

* * * * *